(12) United States Patent
Maeda et al.

(10) Patent No.: US 7,038,353 B2
(45) Date of Patent: May 2, 2006

(54) SURFACE ACOUSTIC WAVE DEVICE AND METHOD OF MANUFACTURING THE SAME

(75) Inventors: Yoshio Maeda, Nagano-Ken (JP);
Shouichi Komatsu, Nagano-ken (JP);
Yusuke Kinoshita, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 157 days.

(21) Appl. No.: 10/220,759

(22) PCT Filed: Dec. 13, 2001

(86) PCT No.: PCT/JP01/10953

§ 371 (c)(1),
(2), (4) Date: Sep. 5, 2002

(87) PCT Pub. No.: WO02/056466

PCT Pub. Date: Jul. 18, 2002

(65) Prior Publication Data

US 2003/0020367 A1 Jan. 30, 2003

(30) Foreign Application Priority Data

Jan. 10, 2001 (JP) ................................. 2001-3025

(51) Int. Cl.
*H03H 9/25* (2006.01)
(52) U.S. Cl. ................................. 310/313 D
(58) Field of Classification Search ............ 310/313 R, 310/313 D
See application file for complete search history.

(56) References Cited

U.S. PATENT DOCUMENTS

| 4,306,456 A | * | 12/1981 | Maerfeld | 73/514.28 |
| 6,127,769 A | * | 10/2000 | Kadota et al. | 310/313 B |
| 6,377,139 B1 | * | 4/2002 | Horiuchi et al. | 333/193 |
| 6,731,044 B1 | * | 5/2004 | Mukai et al. | 310/313 R |

FOREIGN PATENT DOCUMENTS

| JP | A 60-251711 | | 12/1985 |
| JP | A 62-111513 | | 5/1987 |
| JP | 62-128206 | * | 6/1987 |
| JP | 07-131287 A | * | 10/1993 |
| JP | A-7-106911 | | 4/1995 |
| JP | A 9-46169 | | 2/1997 |
| JP | A-9-69751 | | 3/1997 |
| JP | 2000-106519 | * | 4/2000 |
| JP | A 2000-252789 | | 9/2000 |

* cited by examiner

*Primary Examiner*—Thomas M. Dougherty
(74) *Attorney, Agent, or Firm*—Oliff & Berridge, PLC

(57) ABSTRACT

The invention provides a piezoelectric substrate in the form of a rectangular plate in which a Rayleigh wave is propagated, and an IDT and a reflector are provided by forming interdigital electrodes on the piezoelectric substrate. At least an end face on a shorter side of the piezoelectric substrate on a top side thereof is formed as a vertical smooth surface that is substantially in parallel with a conductor strip at an end of the reflector in the position of an imaginary node of a stress wave exiting the conductor strip, thereby providing a reflecting end face to reflect the stress wave.

4 Claims, 32 Drawing Sheets

RAYLEIGH WAVE

SH WAVE

SH WAVE

SH WAVE

RAYLEIGH WAVE

Fig. 25
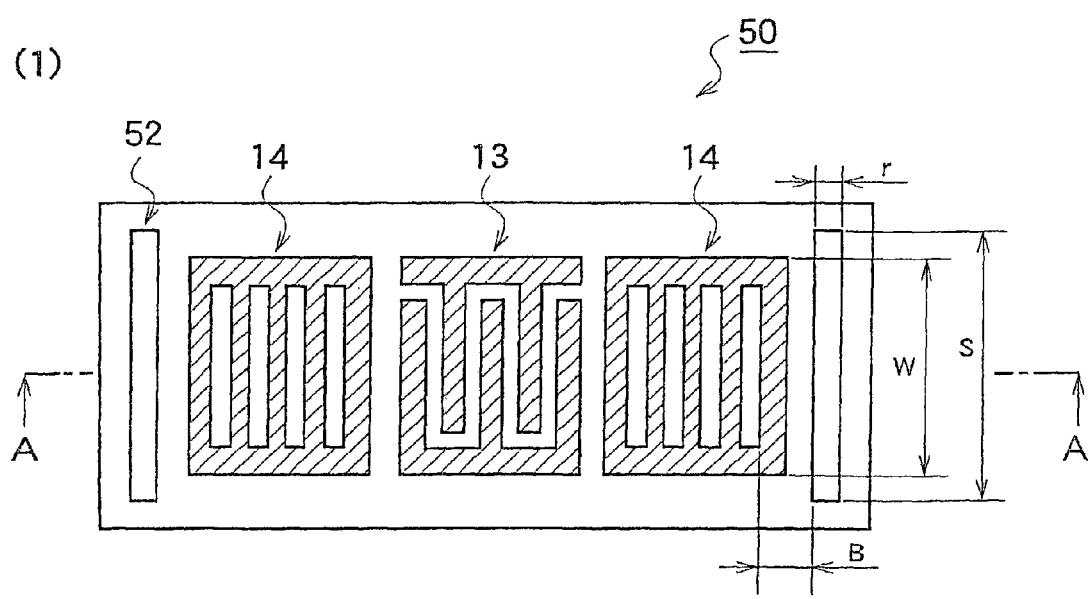
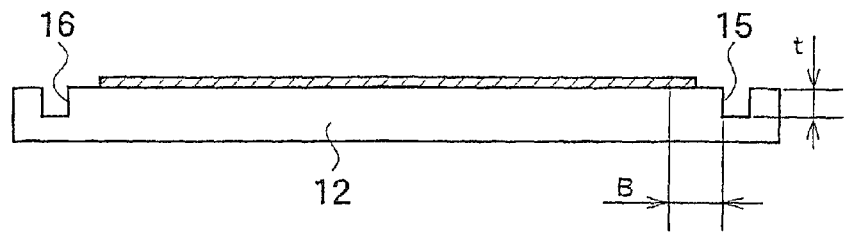

Fig. 29
(1)
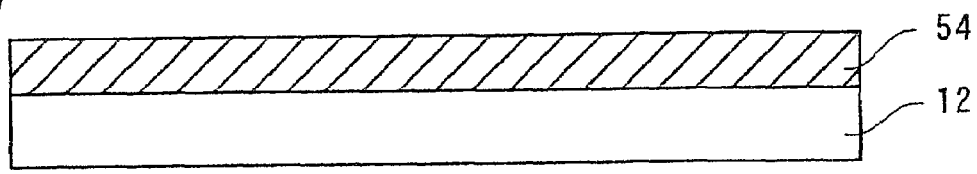
(2)
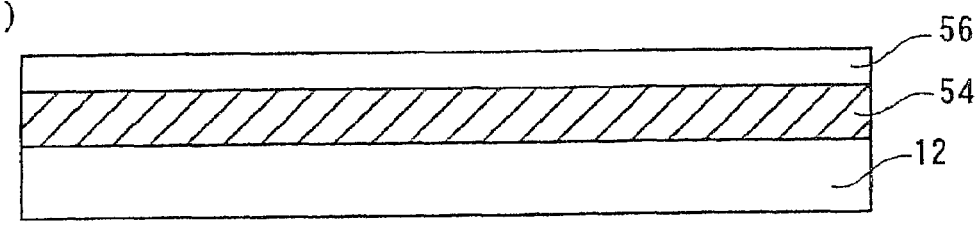
(3)
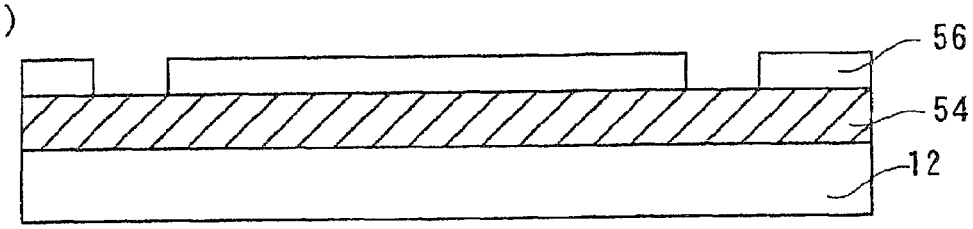

Fig. 30
(1)
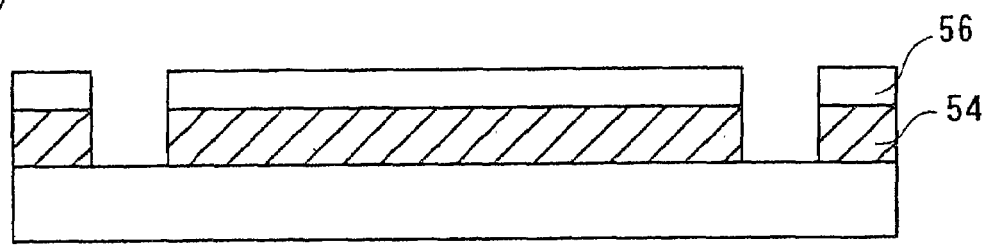
(2)
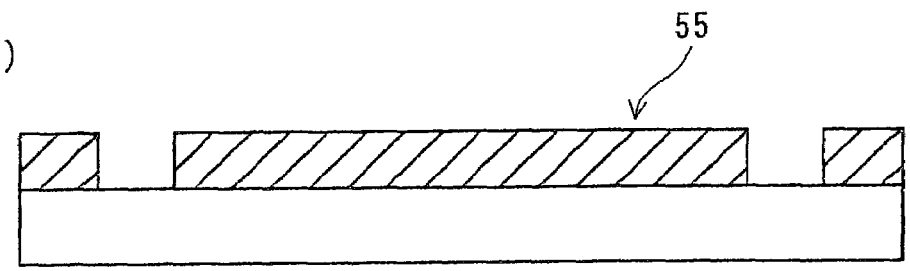
(3)
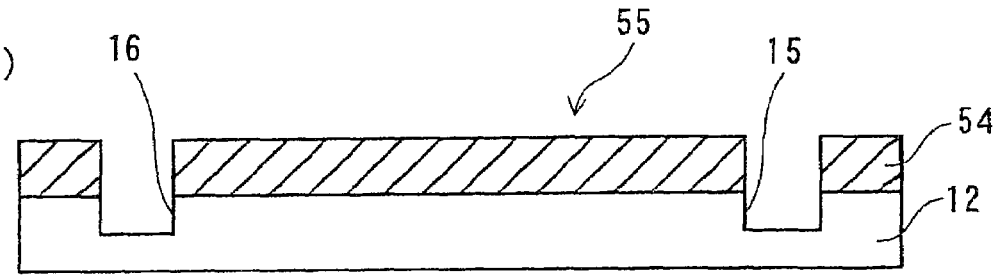

Fig. 31
(1)
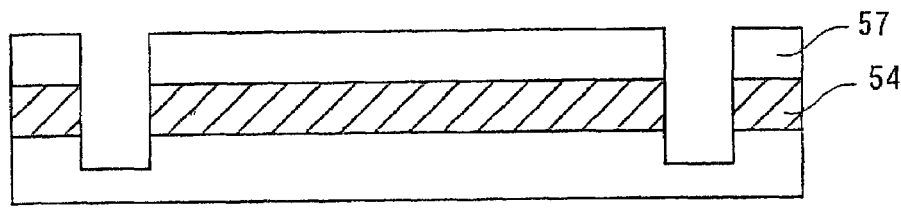
(2)
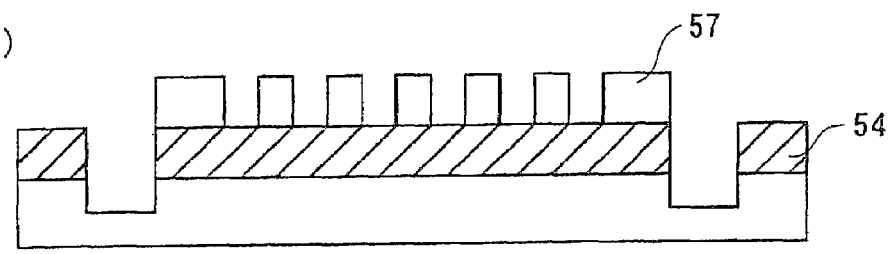
(3)
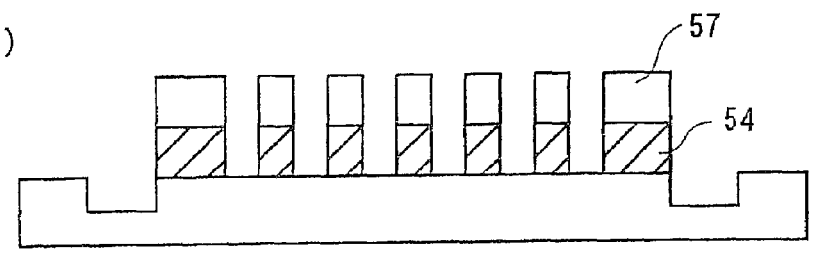
(4)
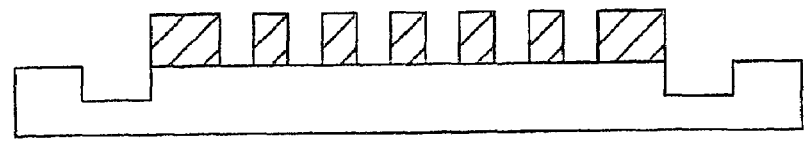

Fig. 38
(1)
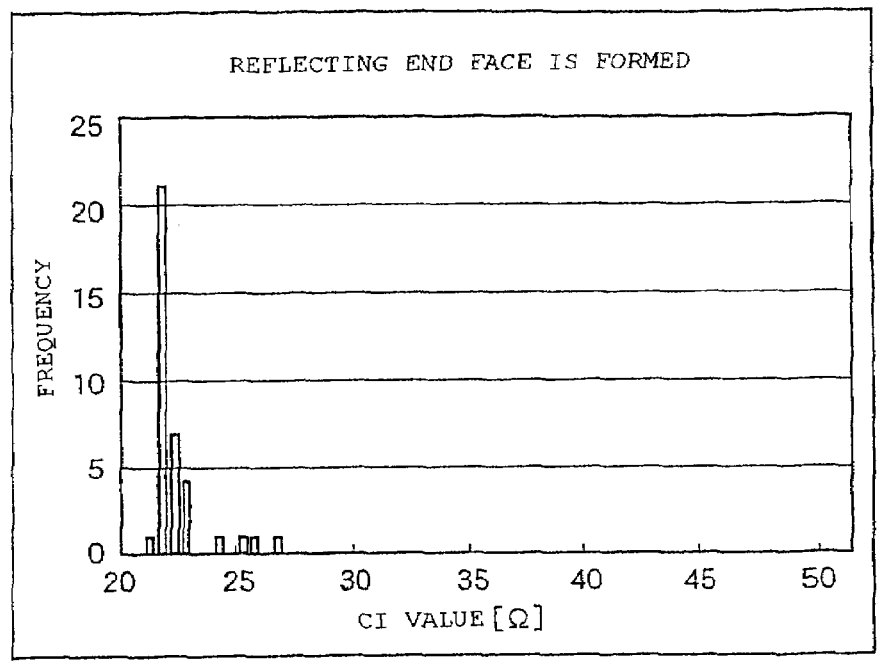
(2)
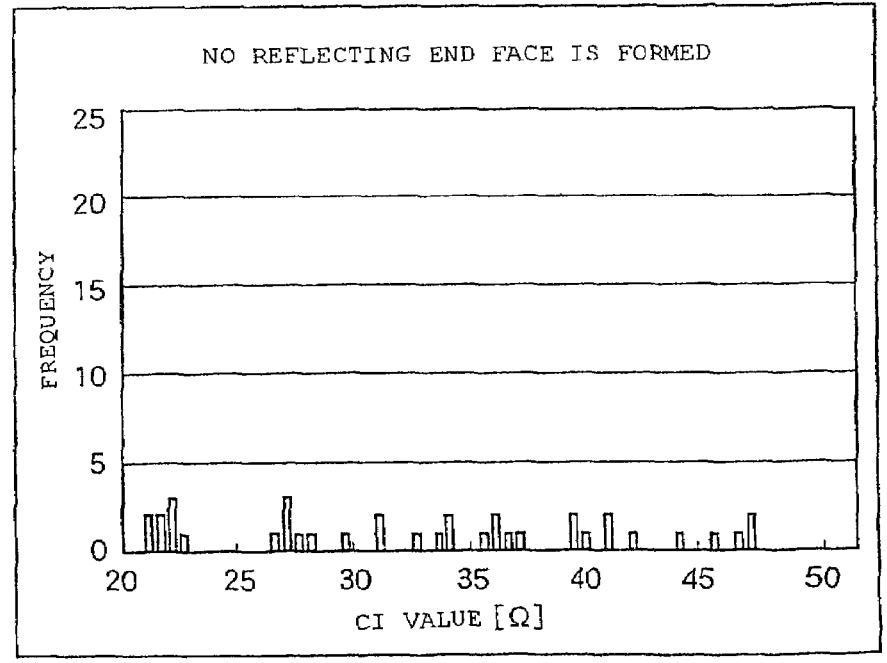

SURFACE ACOUSTIC WAVE DEVICE AND METHOD OF MANUFACTURING THE SAME

BACKGROUND OF THE INVENTION

1. Field of Invention

The present invention relates to a surface acoustic wave device having interdigital electrodes to perform conversion between an electrical signal and a surface acoustic wave. More particularly, the invention relates to a compact surface acoustic wave device adapted to a low frequency.

2. Description of Related Art

Surface acoustic wave devices (hereinafter "SAW devices") have recently been used as resonators, band-pass filters and the like, for example, in electronic components and communication components of portable telephones, television sets and the like, for example.

FIG. 15 is a plan view showing an example of a related art SAW device.

A SAW device 1 is a single-port type SAW resonator which has a piezoelectric substrate 2, and an interdigital transducer (IDT) 3 and reflectors 4.

The piezoelectric substrate 2 is formed like a rectangular plate from quartz, for example. The IDT 3 and the reflectors 4 are formed in an interdigital configuration using photolithography or the like after forming a conductive metal in the form of a thin film on a top surface of the piezoelectric substrate 2 using vacuum deposition, sputtering, or the like.

Specifically, the IDT 3 is a plurality of electrode digits 3a that are arranged side by side at a predetermined pitch and are formed such that longitudinal ends thereof are alternately shorted. That is, comb-tooth portions of two comb-shaped electrodes are formed such that they are interdigitated with each other at predetermined distances. The IDT 3 performs conversion between an electrical signal and a surface acoustic wave (SAW) through an external terminal 5 that is electrically connected thereto.

The reflector 4 is a plurality of conductor strips 4a that are arranged side by side at a predetermined pitch, and are formed such that both longitudinal ends thereof are shorted. For example, two reflectors 4 having the same configuration are formed such that the conductor strips 4a are formed in parallel with the electrode digits 3a of the IDT 3 and sandwich the IDT 3 at predetermined distances from the each reflectors in a propagating direction of a surface acoustic wave, i.e., a direction orthogonal to the longitudinal direction of the electrode digits 3a of the IDT 3. The reflectors 4 reflect a surface acoustic wave propagated from the IDT 3 and contain the energy of the surface acoustic wave therein.

In such a configuration, when an electrical signal is input to the IDT 3 through the external terminal 5, it is converted into a surface acoustic wave because of a piezoelectric effect. The surface acoustic wave is propagated in a direction orthogonal to the longitudinal direction of the electrode digits 3a of the IDT 3 and directed toward the reflectors 4 from both sides of the IDT 3. At this time, a surface acoustic wave that has a propagating speed determined by the material of the piezoelectric substrate 2, the thickness of the electrodes, the width of the electrodes, and a wavelength equal to an electrode period $d_0$ of the electrode digits 3a of the IDT 3, is most strongly excited. The surface acoustic wave is subjected to multiple reflection by the reflectors 4 to be returned to the IDT 3, and is converted into an electrical signal having a frequency (operating frequency) near a resonance frequency which is then output from the IDT 3 through the external terminal 5.

The above-described related art technique has the following problem.

The recent trend is to make various information apparatuses carrying SAW devices to be very compact. This results in a need to reduce in the size various SAW devices including SAW devices adapted to high frequencies and SAW devices adapted to low frequencies in accordance with the purpose of the apparatus to which they are loaded.

The types of surface acoustic waves utilized for SAW devices include waves referred to as Rayleigh waves and waves referred to as SH waves (share horizontal waves).

Referring to the propagating speeds of those surface acoustic waves, for example, a Rayleigh wave has a speed of 3150 m/sec when propagating in an ST-cut quartz X, and an SH wave has a speed of 5000 m/sec when propagating in a 36 degree rotated Y-cut quartz Y.

Since a SAW device has a frequency $f=v/\lambda$ ("v" represents the acoustic velocity of the piezoelectric substrate, and "$\lambda$" represents the wavelength of the vibrational wave), it has a longer wavelength and greater IDT intervals, the lower the frequency f. Therefore, there is a stronger need for the use of a Rayleigh wave that has a low speed in reducing the size of a SAW device adapted to a low frequency.

The Rayleigh waves and SH waves are different in characteristics as described below.

FIG. 16 illustrates displacement components of a Rayleigh wave in a piezoelectric substrate 2, and the Rayleigh wave has a displacement component U3 in a depth direction of the piezoelectric substrate 2 and a displacement component U1 on a top surface of the piezoelectric substrate 2 in a direction orthogonal to the depth direction when the wave travels in a propagating direction A. The wave as a whole resembles a wave on the surface of the water.

On the contrary, FIG. 17 illustrates displacement components of an SH wave in the piezoelectric substrate 2. While the SH wave is traveling in the propagating direction A, it is substantially occupied by displacement components U2 in a direction orthogonal thereto, which appears as shown in FIG. 18 when viewed from above.

For example, while piezoelectric substrates in which an SH wave and a Rayleigh wave are propagated may use the same quartz, they have different cutting angle orientations and propagating directions which will be described below, as shown in FIG. 19. In the case of the quartz substrate shown in FIG. 19 propagating an SH wave in which the cutting angle orientation ($\phi$, $\theta$, $\psi$) of the piezoelectric substrate is (0, 126, 90), relative displacement components U1, U2, U3 of the SH wave associated with the coordinate shown in FIG. 20 are as shown in FIG. 21 in which the Z-direction of FIG. 20 is shown in a normalized form with a wavelength along the abscissa axis and the relative displacement is plotted along the ordinate axis.

FIG. 22 similarly illustrates each of relative displacement components U1, U2, U3 in the case of a piezoelectric material to propagate a Rayleigh wave in which the cutting angle orientation ($\phi$, $\theta$, $\psi$) of the piezoelectric substrate in FIG. 19 is (0, 123, 0).

Thus, in the case of a Rayleigh wave, the displacement U3 in the depth direction Z of the piezoelectric material gradually decreases compared to that of an SH wave.

Further, while in accordance with the related art, an SH wave can be reflected at an end face of the piezoelectric substrate 2 that is perpendicular to the traveling direction of the surface acoustic wave because it is a transverse wave, a Rayleigh wave is not returned because it is transformed into a bulk wave at the end face of the piezoelectric substrate 2 perpendicular to the traveling direction of the surface acoustic wave While a piezoelectric material that propagates a Rayleigh wave must be used to fabricate a compact SAW device adapted to a low frequency taking the above-described points into consideration, a reflector is indispensable in this case in order to contain energy because the surface acoustic wave cannot be reflected at an end face of the substrate.

In addition, since the surface acoustic wave must be reflected by the reflector with sufficient efficiency, the reflector must be formed with a great number of conductor strips, and a piezoelectric substrate having a sufficient surface area must be used accordingly. This limits the compactness of the device.

SUMMARY OF THE INVENTION

The invention addresses or solves the above-described problems, and provides a surface acoustic wave device adapted to a low frequency, and a method of manufacturing the same, which make it possible to achieve and enhance compactness by allowing a Rayleigh wave to be reflected by an end face of a piezoelectric substrate to reduce the number of conductor strips that form a reflector.

According to the invention as set forth in a first aspect, the above-described advantage is achieved by a surface acoustic wave device which has a piezoelectric substrate in the form of a rectangular plate in which a Rayleigh wave is propagated, and an IDT and a reflector provided by forming interdigital electrodes on the piezoelectric substrate. At least an end face of the piezoelectric substrate on a shorter side on a top side thereof is formed as a vertical smooth surface that is substantially in parallel with conductor strips at an end of the reflector in the position of an imaginary node of a stress wave exiting the conductor strips, thereby providing a reflecting end face for reflecting the stress wave.

In the configuration according to the first aspect, an IDT and a reflector are formed on the piezoelectric substrate in the form of a rectangular plate in which a Rayleigh wave is propagated. In this case, by forming at least the end face of the piezoelectric substrate on the shorter side on the top side thereof as an end face having a predetermined configuration, a surface acoustic wave propagating in the piezoelectric substrate can be reflected at the end face. Since a surface acoustic wave is reflected by the end face of the piezoelectric substrate to eliminate the need for reflecting all the surface acoustic wave only by the function of the reflector, the number of the conductor strips of the reflector can be reduced accordingly to allow the piezoelectric substrate to be made to be compact.

According to studies made by the inventors of the subject matter of this application, the following conditions are to be satisfied to reflect a surface acoustic wave that is a Rayleigh wave at the end face of the piezoelectric substrate.

Normally, in a SAW device in which a Rayleigh wave is propagated, a surface acoustic wave is transformed into a bulk wave at an end face in the traveling direction thereof and is not returned. However, it is found that when an IDT and a reflector are provided on the piezoelectric substrate, and a surface acoustic wave traveling from the IDT encounters a reflection wave reflected by the reflector under predetermined conditions, the wave becomes a stress wave that is a simple wave having a simple harmonic motion in the depth direction of the piezoelectric substrate and that is reflected from the reflector toward an end face of the piezoelectric substrate.

In order to realize such a phenomenon, first, the end face of the piezoelectric substrate must be located in the position of an imaginary node of a stress wave exiting conductor strips at an end of the reflector. In this case, it is assumed that no scattering bulk wave that can dissipate vibrational energy is generated because end face free boundary conditions are satisfied and a reflected wave does not hinder the piezoelectric substrate from vibrating at the end face thereof. Further, in order for the end face of the piezoelectric substrate to return the reflected wave properly, the end face must be substantially in parallel with the conductor strips of the IDT and the reflector. This allows the reflected wave to be reflected in a proper direction. The end face of the piezoelectric substrate must be a vertical smooth surface. This reduces or prevents irregular reflection of the reflected wave.

With the SAW device according to the first aspect, a surface acoustic wave propagating in the piezoelectric substrate can be thus reflected by an end face thereof, and thus there is no need to reflect the entire elastic surface wave by only the reflector. Thereby, it is possible to reduce the number of the conductor strips of the reflector accordingly, and to allow the piezoelectric substrate to be formed compactly.

According to the invention set forth in a second aspect, the configuration according to the first aspect is provided to employ a reflecting end face with a distance B from a base end of the conductor strip at the end of the reflector to the reflecting end face being defined as $B=(n \times PR) \pm (PR/2) \times \delta$ (where n is an integer; $PR=\lambda/2$; $\delta$ is an allowance; and $\lambda$ is a wavelength of a Rayleigh wave).

With the configuration according to the second aspect, the position of the reflecting end face can be properly fixed at the position of an imaginary node of said stress wave by finding a position that satisfies the condition that the distance B from the base end of the conductor strips at the end of the reflector to said reflecting end face must satisfy $B=(n \times PR) \pm (PR/2) \times \delta$ (where n is an integer; $PR=\lambda/2$; $\delta$ is an allowance; and $\lambda$ is a frequency.

According to the invention set forth in a third aspect, in the configuration according to the second aspect, the allowance $\delta$ is determined according to the number of the conductor strips of the reflector when the number of pairs of electrode digits of the IDT is fixed.

With the configuration according to the third aspect, dimensional accuracy can be considered according to the number of the conductor strips of the reflector when the position of the reflecting end face is determined.

According to the invention set forth in a fourth aspect, the configuration according to the first to third aspects is provided such that the reflecting end face is provided to a depth at a predetermined distance from the top surface of said piezoelectric substrate in the position of the imaginary node of the stress wave and is configured with a step portion at a bottom end of the reflecting end face.

With the configuration according to the fourth aspect, the formation of the reflecting end face requiring strict positional accuracy is limited to the region up to the predetermined depth from the top surface of the piezoelectric substrate, and thus a cutting step is simplified in forming the reflecting end face by cutting it at the step portion that is out of such a region.

According to the invention set forth in a fifth aspect, the configuration according to the first to fourth aspects is provided such that the reflecting end face is formed when a wafer constituting the piezoelectric material is cut into a size to form each piezoelectric substrate, and at least a part corresponding to the reflecting end face is formed through etching.

With the configuration according to the fifth aspect, the formation of the reflecting end face requiring strict positional accuracy can be performed more easily with higher accuracy compared to cutting or the like using a blade, for example. Since the occurrence of chipping as a result of dicing with a blade can be avoided, the reflecting end face can be formed into a smooth surface.

Further, even when a plurality of SAW devices are formed on a wafer, the configuration according to the fifth aspect makes it possible to form the reflecting end faces at a time through etching. It is therefore possible to achieve a shorter manufacturing time and a reduced manufacturing cost compared to those in case that the reflecting end faces are sequentially formed through dicing, for example.

According to the invention set forth in a sixth aspect, the configuration according to first to fifth aspects is provided such that the reflecting end face is constituted by an inner side surface of a groove formed along the reflector and outside the reflector on the top side of the piezoelectric substrate.

With the configuration according to the sixth aspect, a flat portion can be provided at the periphery of the top surface of the piezoelectric substrate. This makes it possible to maintain air-tightness of a cap member that is joined to the peripheral part of the top surface of the piezoelectric substrate. It is therefore possible to keep a SAW propagation surface airtight.

According to the invention set forth in a seventh aspect, the reflecting end face of the piezoelectric substrate for reflecting a Rayleigh wave which is emitted by the IDT on the piezoelectric substrate and which travels on the top surface of the piezoelectric substrate to return it to the IDT is formed in a predetermined position through etching.

With the configuration according to the seventh aspect, the formation of the reflecting end face requiring strict positional accuracy can be performed more easily with higher accuracy compared to dicing or the like using a blade. Since the occurrence of chipping as a result of dicing with a blade can be avoided, the reflecting end face can be formed into a smooth surface.

Further, even when a plurality of SAW devices are formed on a wafer, the configuration according to the seventh aspect makes it possible to form the reflecting end faces at a time through etching. It is therefore possible to achieve a shorter manufacturing time and a reduced manufacturing cost compared to those in case that the reflecting end faces are sequentially formed through dicing, for example.

According to the invention set forth in an eighth aspect, the configuration according to the seventh aspect is provided to include the steps of forming an electrode material film on the top surface of the piezoelectric substrate, forming a mask to form the reflecting end face by performing first patterning on the electrode material film, forming the reflecting end face by performing etching using the mask for forming the reflecting end face, and forming an electrode by performing second patterning on the electrode material film.

With the configuration according to the eighth aspect, the electrode material film to form the electrode is also used to produce the mask for forming the reflecting end face, and the piezoelectric substrate is etched to form the reflecting end face. This eliminates the need to form a mask material film to produce the mask to form the reflecting end face separately, and there is no need to remove the mask material film. It is therefore possible to achieve a shorter manufacturing time and a reduced manufacturing cost.

According to the invention set forth in a ninth aspect, the configuration according to the seventh or eighth aspects such that the etching is dry etching.

With the configuration according to the ninth aspect, anisotropic etching can be performed. This makes it possible to accurately form the reflecting end face for which strict positional accuracy is required.

According to the invention set forth in a tenth aspect, the configuration according to the eighth aspect is provided such that the first patterning step includes a lithography step and a step of etching the electrode material film using a mask formed at the lithography step.

According to the invention set forth in an eleventh aspect the configuration according to the eighth aspect is provided such that the second patterning step includes a lithography step and a step of etching the electrode material film using a mask formed at the lithography step.

With the configuration according to tenth or eleventh aspects, it is possible to accurately form the reflecting end face for which strict positional accuracy is required.

According to the invention set forth in a twelfth aspect, the configuration according to the eleventh aspect is provided such that the lithography step at the second patterning step is performed after a mask for resist exposure is positioned relative to the reflecting end face using an alignment mark formed on the electrode material film at the first patterning step.

With the configuration according to the twelfth aspect, a relative positional relationship between the base end of the outermost conductor strip of the reflector and the reflecting end face can be accurately achieved.

According to the invention set forth in the thirteenth aspect, manufacture is performed using the method of manufacturing a surface acoustic wave device according to any of the seventh to eleventh aspects.

With the configuration according to the thirteenth aspect, a surface acoustic wave device having advantages of the configuration according to the seventh to eleventh aspects can be provided.

BRIEF DESCRIPTION OF THE DRAWINGS

FIGS. 25(1) and 25(2) are schematics of a SAW device having grooves formed outside reflectors through etching, where FIG. 25(1) is a plan view, and FIG. 25(2) is a side sectional view taken along plane A—A of FIG. 25(1);

FIGS. 29(1)–29(3) are schematics of the steps for manufacturing the SAW device shown in FIGS. 25(1) and 25(2);

FIGS. 30(1)–30(3) are other schematics of the steps for manufacturing the SAW device shown in FIGS. 25(1) and 25(2);

FIGS. 31(1)–31(4) are other schematics of the steps for manufacturing the SAW device shown in FIGS. 25(1) and 25(2);

FIGS. 38(1) and 38(2) are graphs showing a result of measurement of CI values of a plurality of SAW devices, where FIG. 38(1) shows a result of measurement of CI values of SAW devices whose reflecting end faces are formed through etching, and FIG. 38(2) shows a result of measurement of CI values of SAW devices whose reflecting end faces are not formed through etching.

DETAILED DESCRIPTION OF PREFERRED EMBODIMENTS

A preferred embodiment for carrying out the invention is described below based on the drawings.

Figure 1:
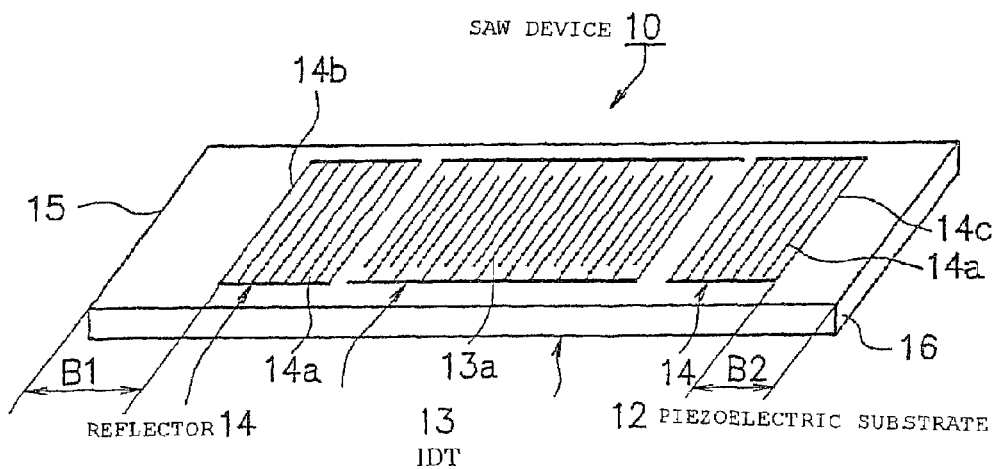
FIG. 1 is a schematic perspective view showing a first embodiment of a SAW device according to the invention.
Figure 2:
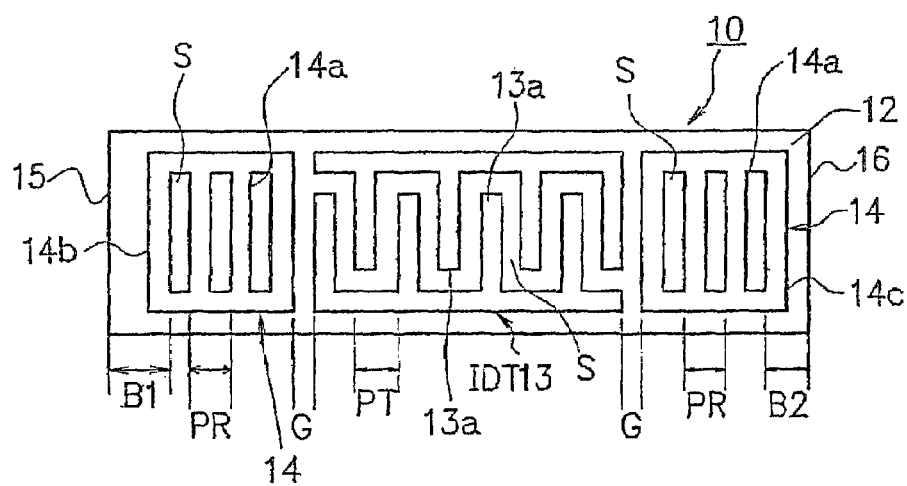
FIG. 2 is a schematic plan view of the SAW device in FIG. 1.

FIG. 1 is a perspective view showing a schematic configuration of a first embodiment for carrying out a SAW device according to the invention. FIG. 2 is a plan view of the same SAW device 10 as shown in FIG. 1, with an IDT 13 and reflectors 14 being shown with a different number of conductor strips to facilitate understanding of various aspects of the invention.

The SAW device 10 has a piezoelectric substrate 12, the IDT 13 and the reflectors 14 that are interdigital electrodes.

Figure 19:
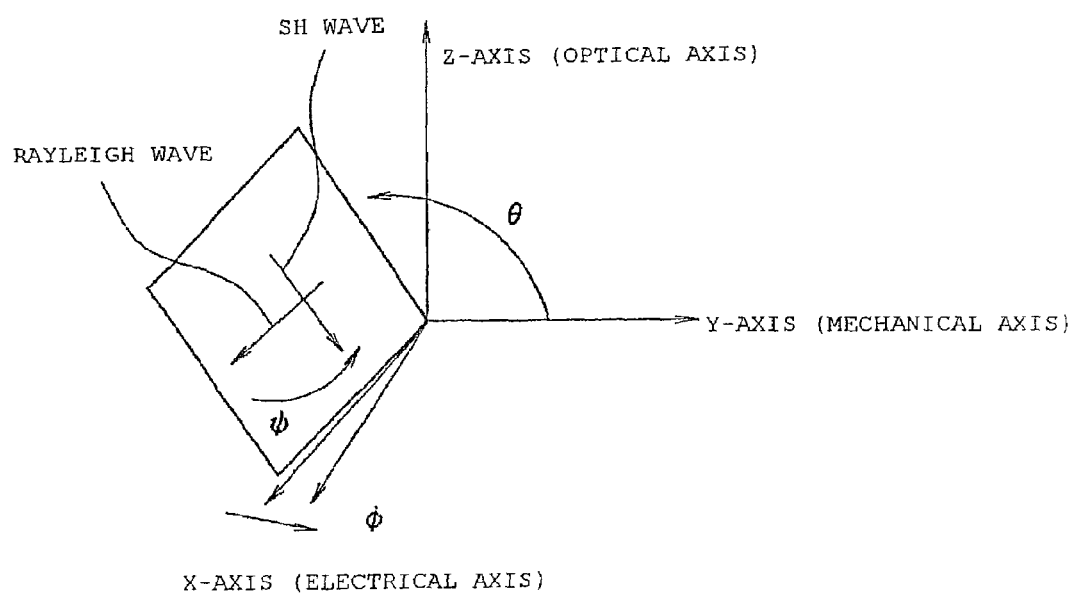
FIG. 19 is a schematic that shows a difference in crystal orientation between a piezoelectric material in which a Rayleigh wave is propagated and a piezoelectric material in which an SH wave is propagated.
Figure 20:
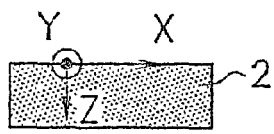
FIG. 20 is a schematic that shows the propagating direction of a surface acoustic wave propagating in a piezoelectric material.
Figure 21:
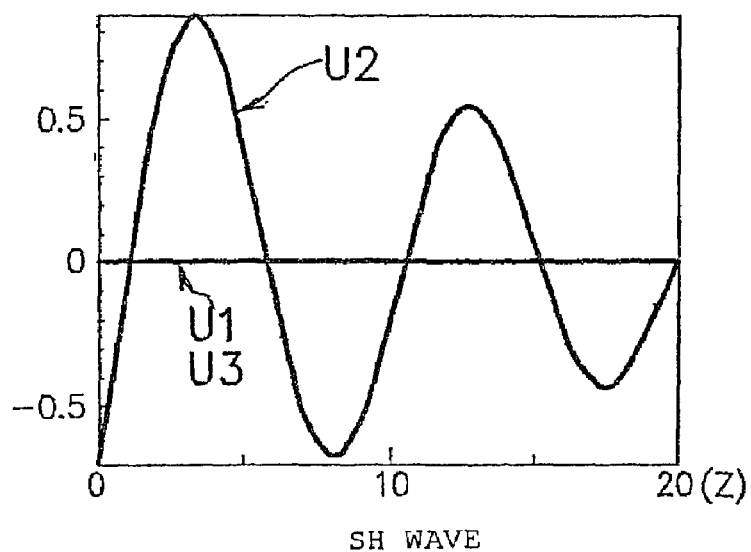
FIG. 21 is a graph that shows relative displacement of displacement components of an SH wave.
Figure 22:
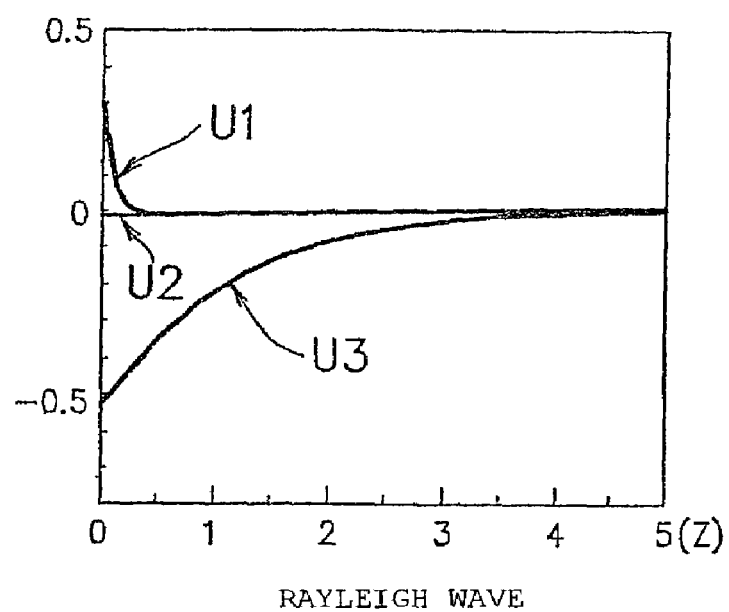
FIG. 22 is a graph that shows relative displacement of displacement components of a Rayleigh wave.

The piezoelectric substrate 12 is constituted by, for example, a layered film substrate, such as a substrate of a single crystal, such as quartz, lithium tantalate ($LiTaO_3$), and lithium niobate ($LiNbO_3$), or a substrate obtained by forming a ZnO film on a Si substrate as a piezoelectric material and is formed so as to have a crystal orientation to propagate a Rayleigh wave as described in FIG. 19. The shape of the piezoelectric substrate 12 is in the form of a rectangular plate, for example, as illustrated, and end faces 15, 16 on respective short sides are defined in positions to be described below in detail.

The IDT 13 and the reflectors 14 are formed with an interdigital configuration by forming a conductive metal such as aluminum or titanium in the form of a thin film on a top surface of the piezoelectric substrate 12 using vacuum deposition, sputtering or the like, and then by performing photolithography or the like.

Figure 15:
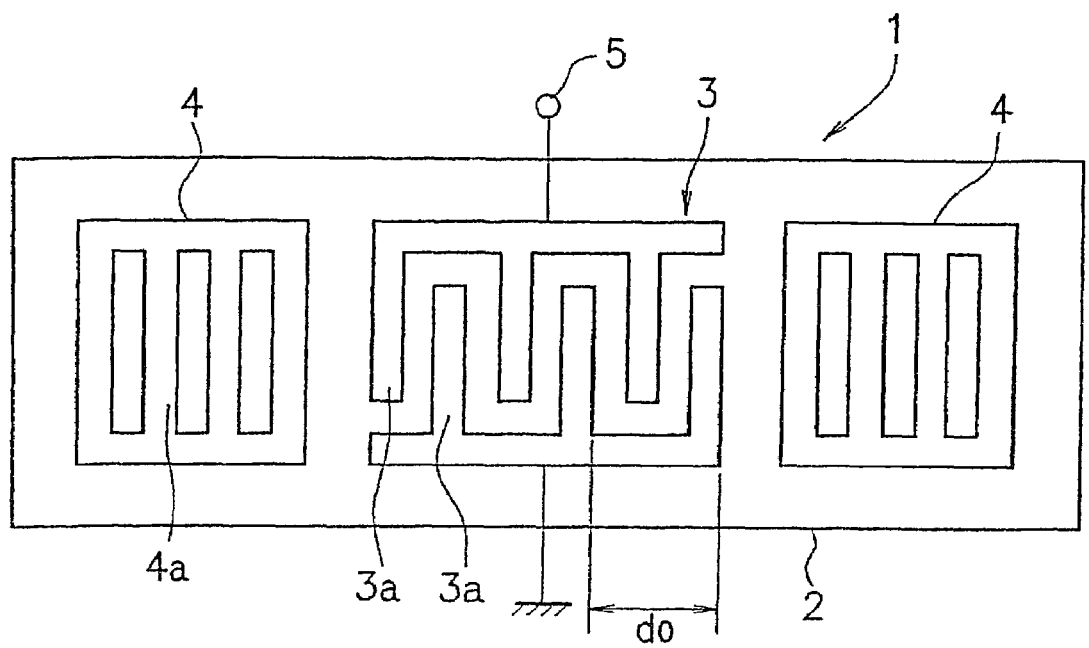
FIG. 15 is a schematic plan view showing a related art SAW device.
Figure 16:
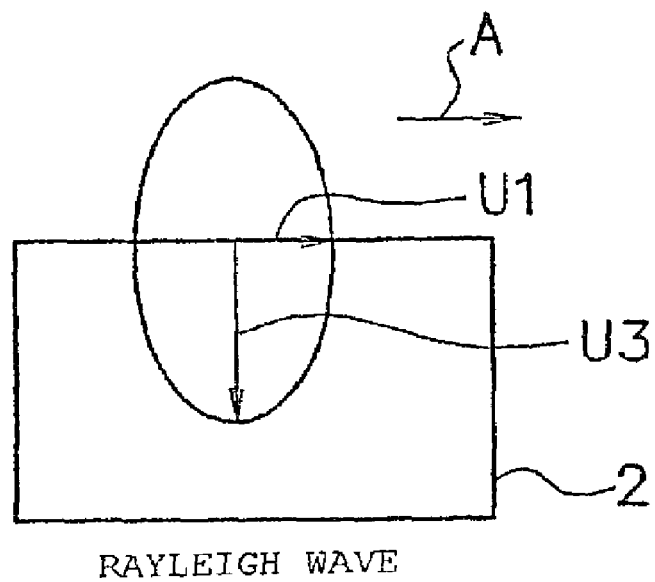
FIG. 16 is a conceptual schematic for explaining a Rayleigh wave propagating in a piezoelectric material.
Figure 17:
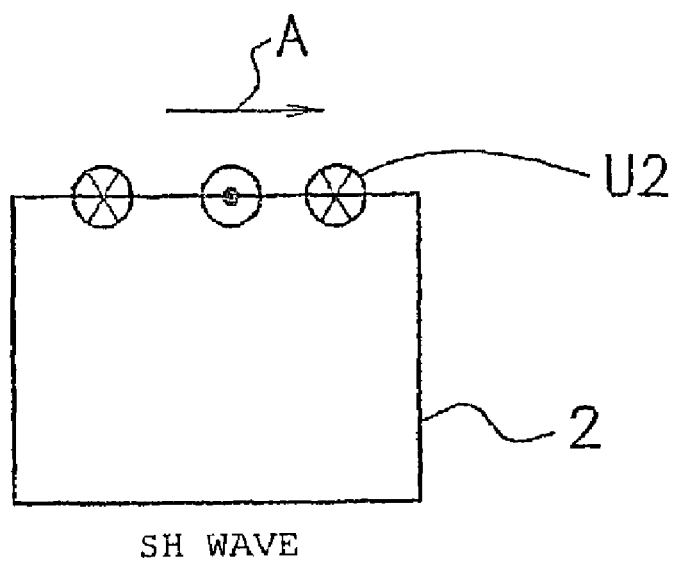
FIG. 17 is a conceptual schematic for explaining an SH wave propagating in a piezoelectric material.
Figure 18:
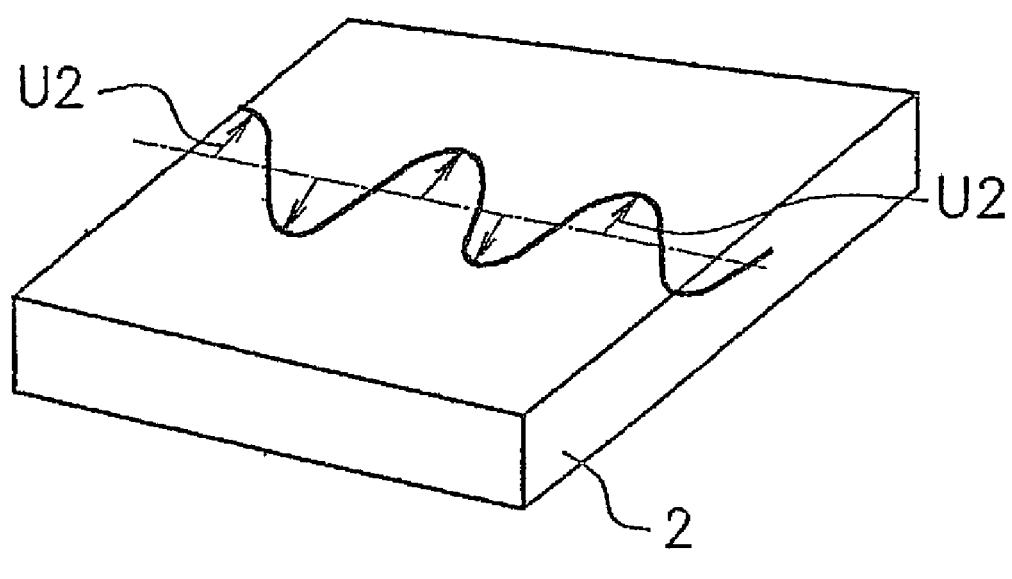
FIG. 18 is a schematic perspective view for explaining a SH wave propagating in a piezoelectric material.

Specifically, the IDT 13 is formed such that a plurality of electrode digits 13a are arranged side by side at twice a predetermined pitch PT that is defined by a space S, and such that longitudinal ends thereof are shorted. That is, it is formed such that comb-tooth portions of two comb-shaped electrodes are interdigitated with each other at a predetermined distance. The IDT 31 performs conversion between an electrical signal and a surface acoustic wave (SAW) through an external terminal 5 shown in FIG. 15 that is electrically connected thereto.

The reflectors 14, 14 are provided on both sides of the IDT 13 with respective gaps G defined therebetween. The reflectors 14 are formed such that a plurality of conductor strips 14a are arranged side by side at a predetermined pitch defined by the space S, and such that both longitudinal ends there of are shorted, similarly to the IDT 13.

For example, the two reflectors 14, 14 having the same configuration are formed such that the conductor strips 14a are in parallel with the electrode digits 13a of the IDT 13 and such that they sandwich the IDT 13 in a direction in which a surface acoustic wave is propagated, i.e., a direction orthogonal to the longitudinal direction of the electrode digits 13a of the IDT 13. The reflectors 14, 14 reflect a surface acoustic wave propagated from the IDT 13 and containing the energy of the surface acoustic wave therein.

In the present embodiment for carrying out the invention, the SAW device 10 is formed so as to accommodate a low frequency of about 106 MHz, for example, and a chip is used which has a small size to allow the IDT 13 to have 60 pairs (the number of pairs of the electrode digits 13a that are paired) and to allow the reflectors 14 to have about 105 conductor strips.

Figure 3:
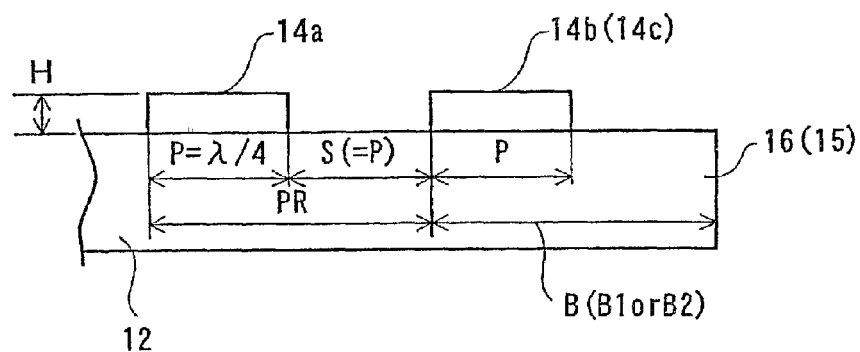
FIG. 3 is an enlarged sectional view showing a part of the SAW device in FIG. 1 in an enlarged scale.

FIG. 3 is an enlarged sectional view of apart of the SAW device 10 including the reflectors 14 and an end face of the piezoelectric substrate.

FIG. 3 shows some dimensions of the reflectors 14, and a width P of a reflector 14a is the same as that of a reflector 14b, and both of the reflectors 14a and 14b have a width that is the same as the space S. PR that is the sum of the width P of the reflector 14a (an electrode digit 13a shown in FIG. 2 has the substantially same width) and the space S is set at $\lambda/2$ ($\lambda$ represents the wavelength of a surface acoustic wave). Therefore, each of the space S and the width P of the reflector 14a is set at $\lambda/4$.

Therefore, the pitch P and the width of the electrode digits 13a (the conductor strip 14a also has substantially the same width) is set at $\lambda/4$. A height H of the electrode digits 13a is set such that it substantially satisfies $H/\lambda=0.02$ to $0.04$.

In the present embodiment for carrying out the invention, at least the end faces 15, 16 on the shorter sides on the top side of the piezoelectric substrate 12 are set in the positions of imaginary nodes of respective stress waves exiting conductor strips 14b, 14c at ends of the reflectors, by which reflecting end faces for reflecting the stress waves are provided.

The reflecting end faces 15, 16 are described in detail below.

In the present embodiment for carrying out the invention, as described above, a piezoelectric substrate 12 that propagates a Rayleigh wave is used to form the SAW device 10 adapted to a low frequency (of about 106 MHz, for example) with a small size.

In such a SAW device that propagates a Rayleigh wave, as already described, in the related art it has been considered that a surface acoustic wave is not normally returned because it is transformed into a bulk wave at an end face in its traveling direction. However, it is found that when the IDT 13 and the reflectors 14 are provided on the piezoelectric substrate 12, and a surface acoustic wave traveling from the IDT encounters a reflection wave reflected by the reflectors under predetermined conditions, the surface acoustic wave becomes a stress wave T as a simple wave having a simple harmonic motion in the depth direction of the piezoelectric substrate 12, and the stress wave is then emitted from the reflectors 14 toward the end faces 15, 16 of the piezoelectric substrate.

Figure 4:
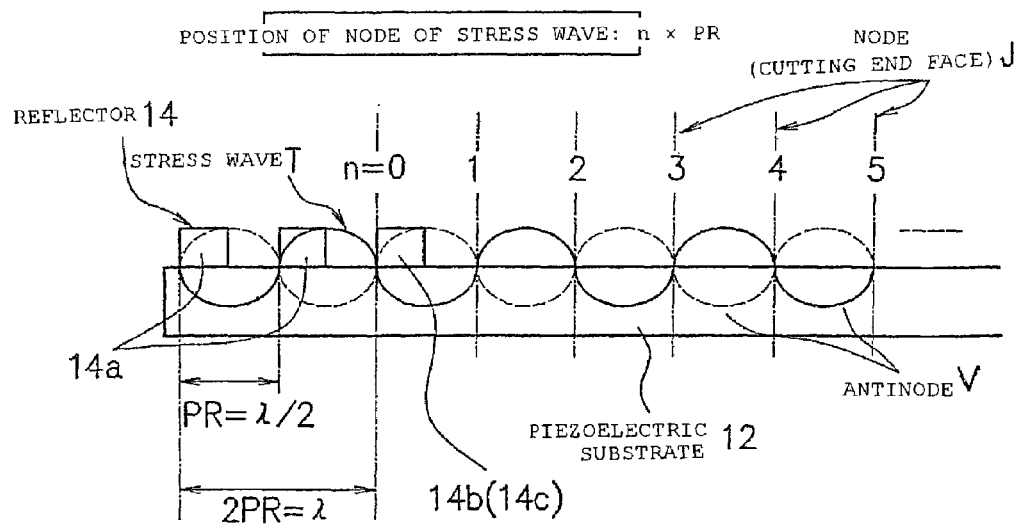
FIG. 4 is a schematic of a technique for finding a position for a reflecting end face of the SAW device in FIG. 1.
Figure 5:
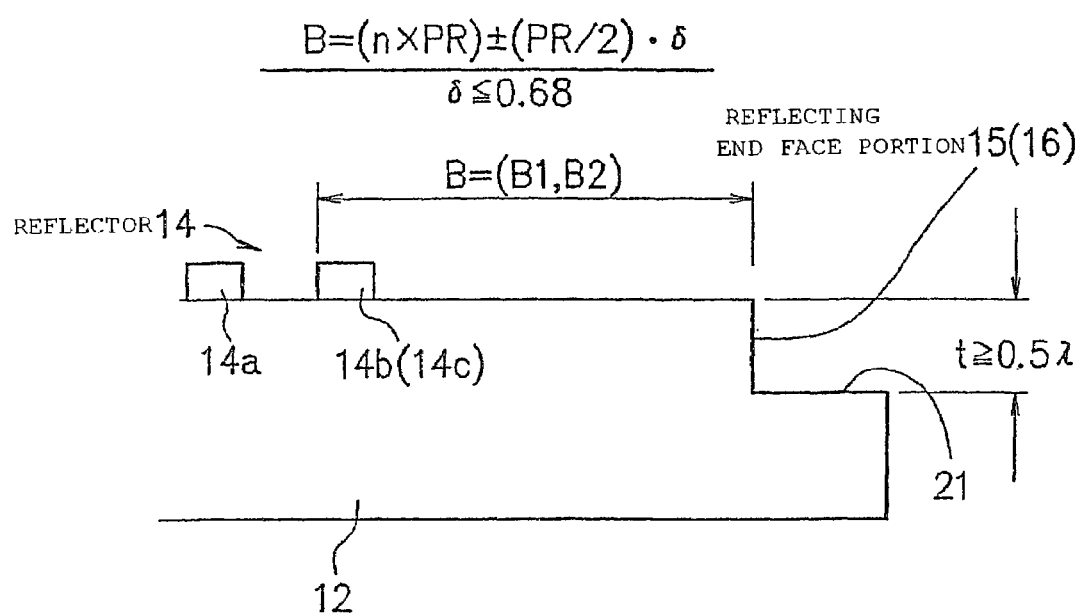
FIG. 5 is a schematic enlarged sectional view of an end of a piezoelectric substrate associated with the SAW device in FIG. 1.

As one of conditions to form such reflecting surfaces, the position 15 (16) of the end face of the piezoelectric substrate 12 shown in FIG. 5 must be the position of an imaginary node J of the stress wave T shown in FIG. 4 that comes from the conductor strips 14b, 14c at an end of the reflectors 14.

FIG. 4 is a schematic of a technique for finding such a position of an end face.

FIG. 4 is an imaginary view of a waveform of such a stress wave T that is a wave having a simple harmonic motion. In FIG. 4, such a stress wave T has a period $\lambda$ which is the same as that of a surface acoustic wave, and nodes J and antinodes V of the stress wave T alternate at $\lambda/2$.

Therefore, the position of an end face of the piezoelectric substrate 12 that can be a reflecting end face is given as follows because the position of a node J of the stress wave T repetitively comes at every half-wavelength where an inner end of the conductor strips 14b, 14c at an end of the reflectors 14 is the base end.

Position of reflecting end face=$n \times PR$      Equation (1)

FIG. 5 is a schematic enlarged sectional view of an end of the piezoelectric substrate 12 associated with the SAW device 10 in FIG. 1. In FIG. 5, the position in which an end face of the piezoelectric substrate 12 is to be provided is a position that is outwardly spaced a distance B from the base end of the conductor strip 14b or 14c located at the outermost end of a reflector 14.

Based on the above Equation (1), the distance B is provided as follows:

Position B of reflecting end face=$(n \times PR) \pm (PR/2) \times \delta$      Equation (2)

(where n represents an integer, and $\delta$ represents an allowance that is to be described later)

In FIG. 1 and FIG. 2, the difference between the magnitudes of B1 and B2 which correspond to the distance B is attributable to different values of n described above, and B1 and B2 may be equal to each other as long as the above Equation (2) is satisfied.

When the end faces 15, 16 are provided in such positions that are outwardly spaced the distance B from the base end of the conductor strip 14b or 14c located at an outermost end of a reflector 14, the end face free boundary conditions are satisfied at the end face of the piezoelectric substrate 12, and a reflected wave does not hinder the vibration of the piezoelectric substrate 12. It is therefore considered that a surface acoustic wave can be reflected without generating a scattering bulk wave that dissipates vibrational energy.

In order for the end face 15, 16 of the piezoelectric substrate 12 to return a reflected wave properly, the end face thereof needs to be substantially in parallel with the electrode digits 13a and the conductor strips 14a of the IDT 13 and the reflector 14, respectively. This allows the reflected wave to be reflected in a proper direction.

The end faces 15, 16 of the piezoelectric substrate 12 must be vertical smooth surfaces. This prevents irregular reflection of a reflected wave.

Further, as shown in FIG. 5, it is not necessary to provide the reflecting end faces 15, 16 of the piezoelectric substrate 12 such that they extend the entire thickness thereof, and step portions 21 may be left to provide the end faces as vertical surfaces inside the step portions 21, for example. In this case, the depth t of the reflecting surfaces 15, 16 corresponds to the thickness of the piezoelectric material of the piezoelectric substrate 12 that contributes to the propagation of a surface acoustic wave, and such a depth t is preferably set to be equal to or greater than $\lambda/2$.

When the reflecting end faces of the SAW device 10 in FIG. 1 are formed to leave the step portions 12 as described in FIG. 5, a method of manufacture as is described below can be employed with advantages in manufacture.

Figure 6:
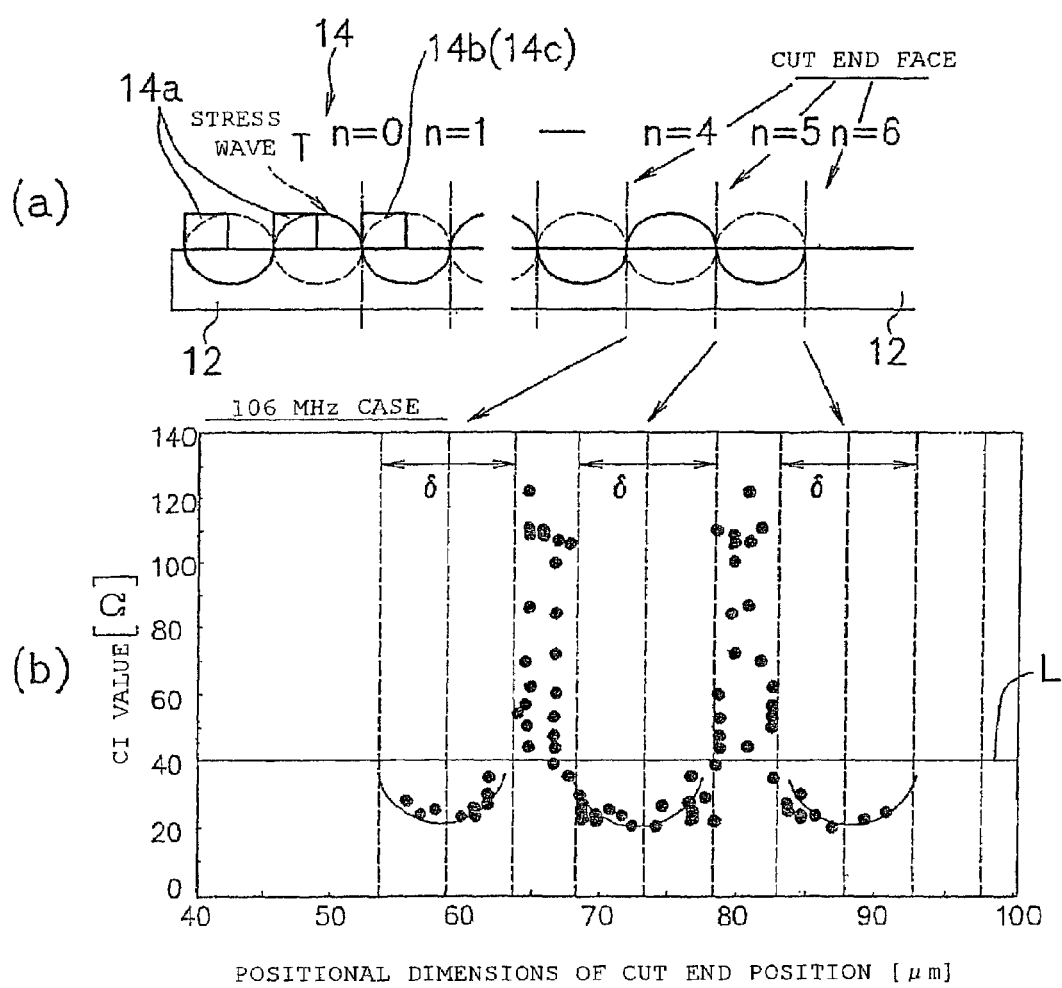
FIGS. 6(a) and 6(b) are schematics of CI (crystal impedance) values in association with changes in the position of the reflecting end face of the SAW device in FIG. 1.

FIGS. 6(a) and 6(b) show CI (crystal impedance) values of the SAW device 10 obtained when the reflecting end faces 15, 16 of the piezoelectric substrate 12 are formed with the value n varied based on the above-mentioned Equation (2).

FIG. 6(a) shows positions obtained by setting several integers, i.e., 4, 5, and 6 as the value n, and FIG. 6(b) is a graphic summary of CI values obtained when the reflecting end faces 15 and 16 are provided in each of the positions, the abscissa axis being associated with changes in the positions of the reflecting end faces 15 and 16, the ordinate axis being associated with CI values.

As shown in FIG. 6(b), CI values periodically change in according to each n-value in the above Equation (2). For example, it will be understood that when the position of 40 Ω in the illustration is set as an allowance line L, there is an allowance in the range indicated by (PR/2)·δ that satisfies the allowance line L for each of n-value.

Figure 7:
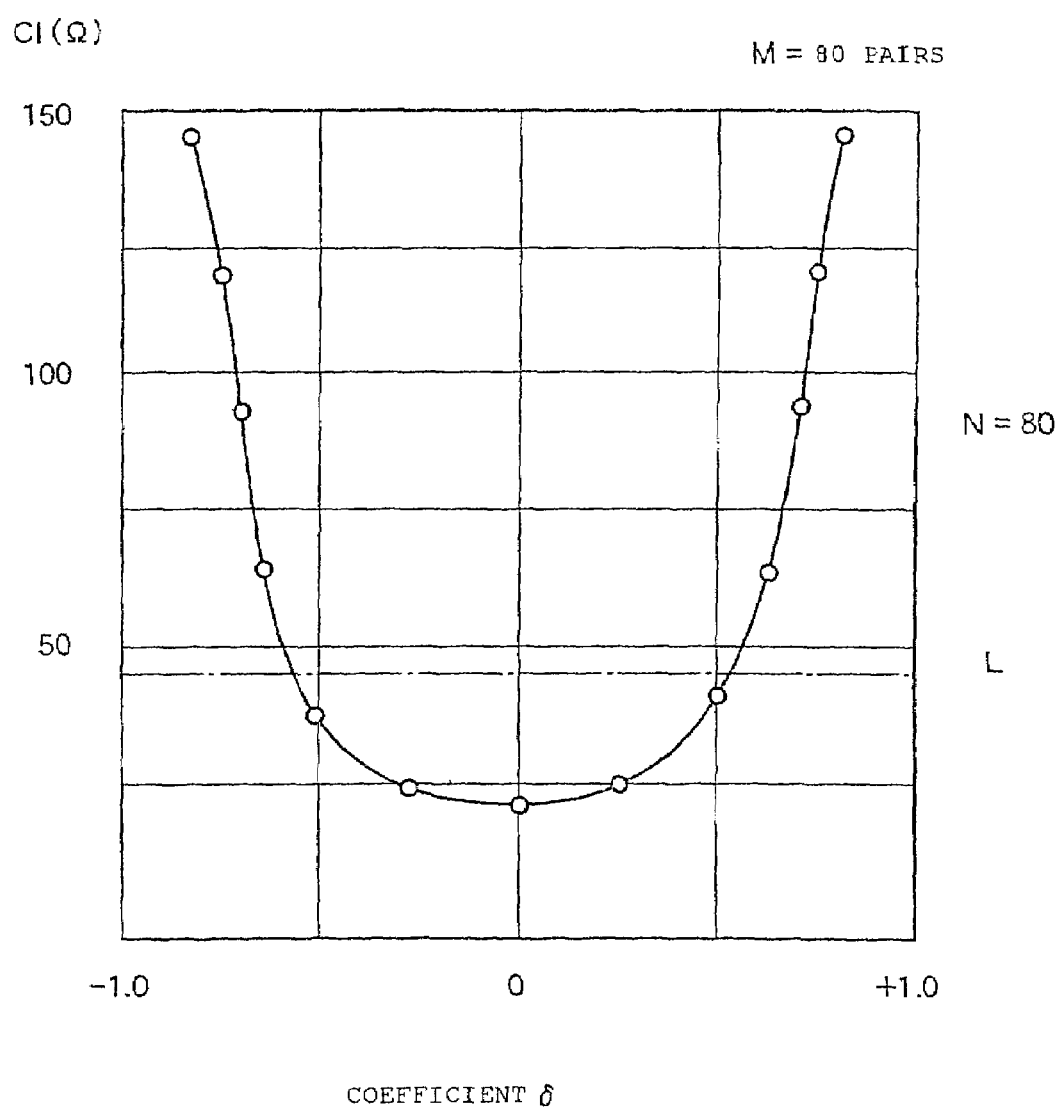
FIG. 7 is a graph of measurements of changes in an allowance δ associated with the position of the reflecting end face of the SAW device in accordance with changes in the number of electrodes of a reflector of the SAW device in FIG. 1.

FIG. 7 is a graph showing a result of simulation of the range of allowance (PR/2)·δ, and a relative tolerance equivalent to ± by (PR/2)·δ is plotted along the abscissa axis while CI-values are plotted along the ordinate axis. Specifically, a position (PR/2) corresponds to a relative tolerance of 0 on the abscissa axis, and positions on the left and right sides of the above position correspond to ±(PR/2)·δ.

In this case, an instance is shown in which the number of the electrode digits 13a of the IDT 13 is fixed at 80 pairs (M=80) and in which the number (N) of the conductor strips 14a of the reflectors 14 is 80. A tolerance for a cutting position in case that the CI-value allowance line L is set at 40 Ω is about 0.6.

Figure 8:
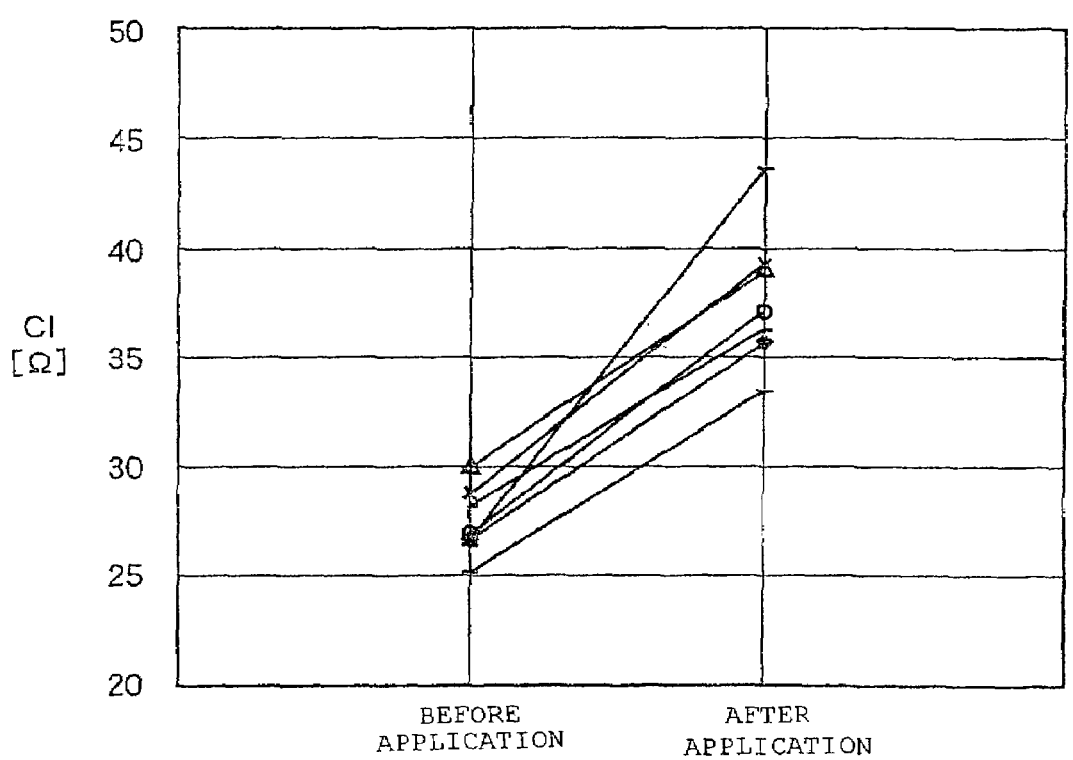
FIG. 8 is a graph of measurements of CI values of the SAW device obtained by applying an elastic material in the regions of both ends of the piezoelectric substrate of the SAW device in FIG. 1.

FIG. 8 shows measurements of CI-values of a SAW device 10 having the same configuration as that of the SAW device 10 described with reference to FIG. 1, and obtained by providing end faces 15 and 16 thereof in positions constituting reflecting end faces as described above and by applying an elastic material, e.g., silicone to the regions of both ends of the piezoelectric substrate 12 (the regions of the reflecting end faces 15, 16) on a trial basis. FIG. 8 shows results of a plurality of experiments carried out under the same conditions.

As illustrated, the application of silicone increases the CI values that were small before the application. That is, it is considered that CI values increases because a surface acoustic wave reaches the reflecting end faces 15, 16 and then is absorbed by the elastic material and is not reflected and returned to the IDT 13, which prevents the energy containing effect from being demonstrated.

In the SAW device 10 in the present embodiment for carrying out the invention, a surface acoustic wave based on a Rayleigh wave propagating in the piezoelectric substrate 12 can be thus reflected at the reflecting end faces 15, 16. Since it is not therefore required to reflect the entire surface acoustic wave only by the function of the reflectors 14, the number of the conductor strips 14a of the reflectors 14 can be reduced accordingly to form the piezoelectric substrate 12 forming a part of the SAW device 10 adapted to a low frequency with a small size.

Figure 9:
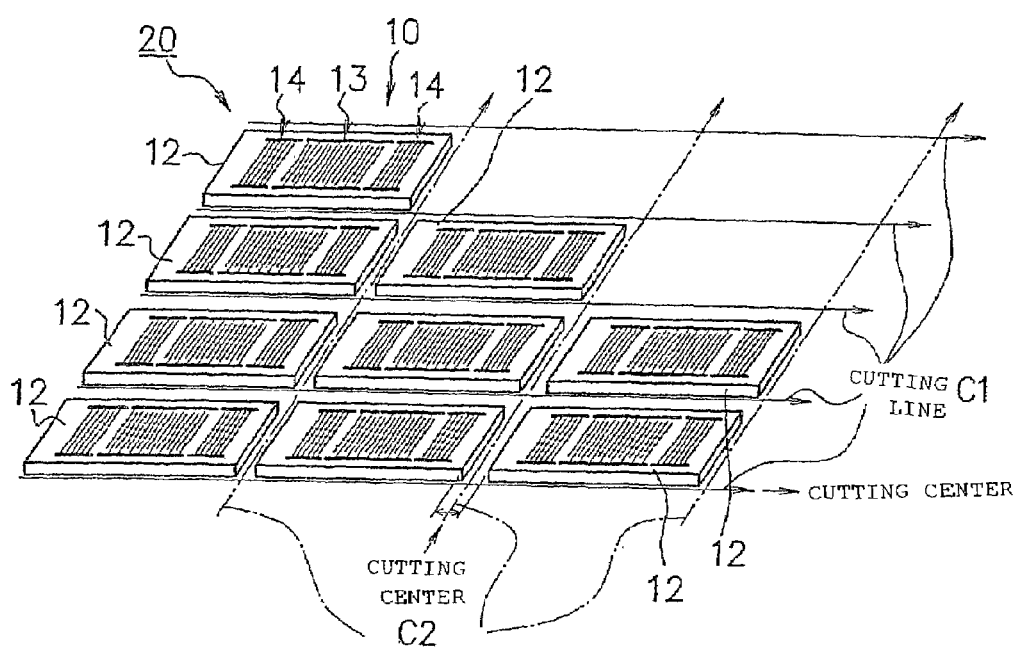
FIG. 9 is a schematic perspective view that shows a step of cutting a wafer from which to form the piezoelectric substrate of the SAW device in FIG. 1 into individual piezoelectric substrates for forming individual SAW devices.
Figure 10:
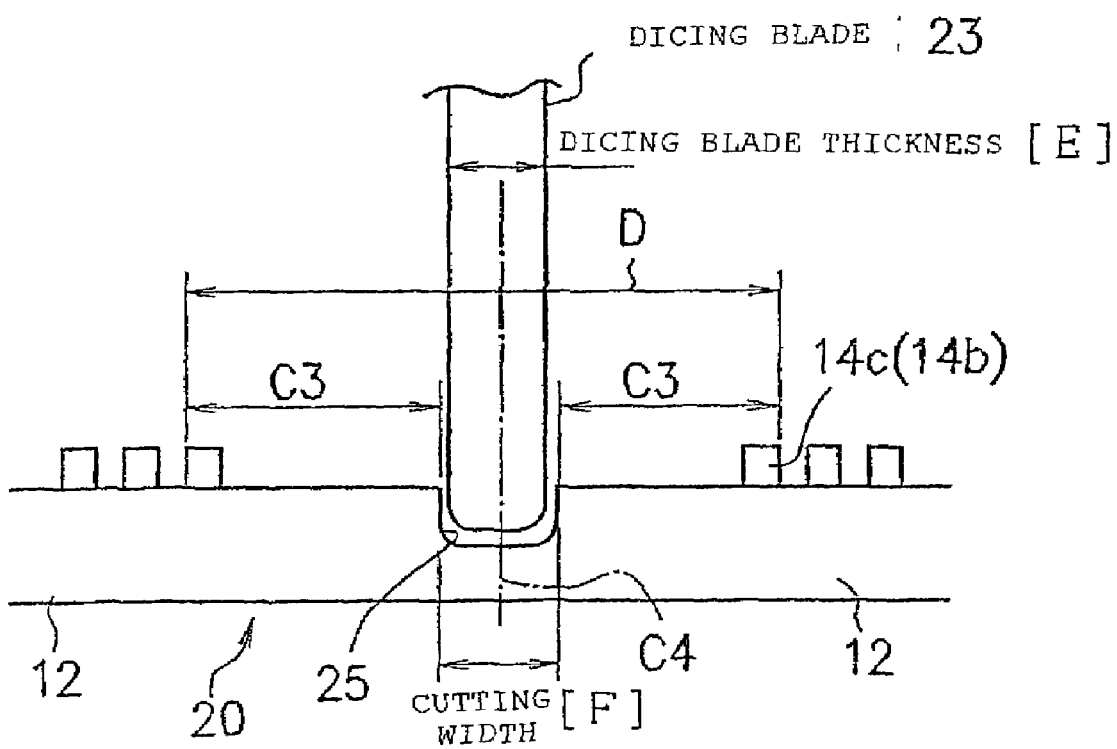
FIG. 10 is an enlarged front view of a part of FIG. 9.

FIGS. 9 and 10 show some of steps for manufacturing the SAW device 10 in the present embodiment for carrying out the invention.

The SAW device 10 in the present embodiment for carrying out the invention is similar to related art devices up to the step of forming a wafer 20 made of quartz, for example, as a piezoelectric material in a configuration having a crystal orientation required to propagate a Rayleigh wave as described above and providing the wafer 20 with a plurality of IDT's 13 and reflectors 14, 14 in the form of a matrix by forming a plurality of electrode digits and conductor strips.

The bottom surface of the wafer 20 having the plurality of IDT's 13 and reflectors 14, 14 formed like a matrix is applied onto a glass plate using hot-melt wax or the like. A cutting step is then performed.

FIG. 9 shows a step of cutting the wafer 20 into individual piezoelectric substrate 12 from which individual SAW devices 10 are formed. Specifically, the wafer 20 is cut along a plurality of cutting lines C1 in parallel with the direction of longer sides of each of the SAW devices 10 and a plurality of cutting lines C2 in a direction orthogonal thereto.

Referring to the step of cutting along the cutting lines C1, high accuracy of a degree associated with the reflecting end faces 15, 16 of the piezoelectric substrate 12 described above is not required because the step is not related to them, and cutting may be appropriately performed with a predetermined blade or the like for example similarly to conventional steps.

On the contrary, the step of cutting along the cutting lines C2 requires more accurate processing because the cutting must be performed such that end faces formed by cutting each piezoelectric substrate 12 along the cutting lines C2 will function as reflecting end faces 15, 16.

FIG. 10 is an enlarged view of a position cut along such a cutting line C2 as viewed from the front side of FIG. 9.

In the wafer 20 in FIG. 10, D represents a distance between base ends of conductor strips 14b, 14c at ends of respective reflectors 14, 14 formed on piezoelectric substrates 12, 12 adjacent to each other in the longitudinal direction thereof; C represents a distance from the base end of each of the conductor strips 14b, 14c of the respective ends to an end face to be formed; E represents the thickness of an edge of a dicing blade 23 used to perform cutting; and F represents an actual cutting width.

A cutting center C4 can be assumed to be located in the middle of the distance D. Then, the distance C3 from the base end of each of the conductor strips 14b, 14c at the respective ends to an end face to be formed is provided as follows from the above-described Equation (1) and the relationship shown in FIG. 10.

$$C3 = n \times PR = (D-E)/2 \quad \text{Equation (3)}$$

Therefore, if the thickness E of the edge of the dicing blade 23 is substantially equal to the cutting width F, some measures must be taken such that the distance C3 from the base end of each of the conductor strips 14b, 14c to the end face to be formed will satisfy n·PR, because of the relationship between the distance D between the base ends of the conductor strips 14b, 14c at the respective ends and the thickness E of the edge of the dicing blade 23 used for cutting.

In order to carry out the above-described method to produce a SAW device 10 having a frequency of 106.25 MHz, by way of example, cutting was performed using a dicing blade 23 whose edge thickness E was 150 µm with the distance D between the base ends of the conductor strips 14b, 14c at the respective ends in FIG. 10 set at 312 µm, for example.

However, the above Equation (3) is developed as follows when each numerical value in this case is substituted in the same.

$$C3 = (D-E)/2$$

$$C3 = (312.6 - 150)/2$$

$$C3 = 81.3 \, (\mu m)$$

Thus, the result is that the distance C3 from the base end of each of the conductor strips 14b, 14c of the respective ends to the end face to be formed is 81.3 (μm).

A study on the result that C3 is 81.3 (μm) to determine whether the end face will function as a reflecting end face in relation to a stress wave has revealed that the wavelength λ will be 29.65 μm because the SAW device 10 to be manufactured has a frequency of 106.25 MHz. Since PR=λ/2, PR is 14.82 (μm) from PR=29.65/2.

Figure 11:
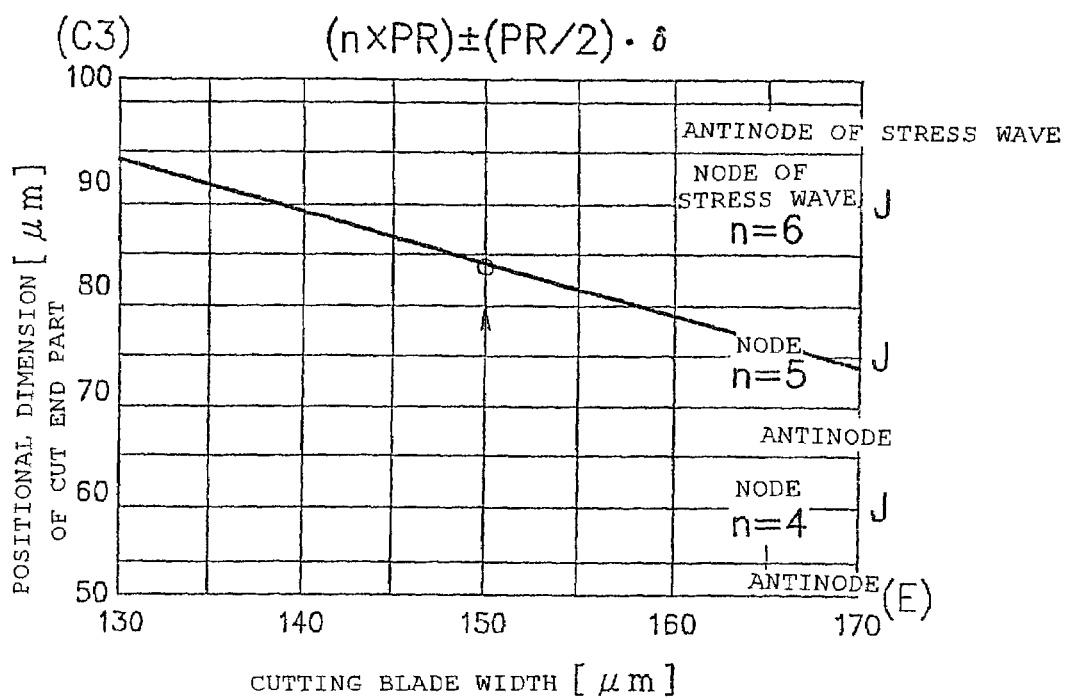
FIG. 11 is a graph, taken in the cutting operation in FIG. 10, showing a thickness E of an edge of a dicing blade along the abscissa axis and showing a distance C3 from each base end of conductor strips to an end face to be formed along the ordinate axis.

FIG. 11 is plotted based on the above, and the FIG. 11 is a graph in which the thickness E of the edge of the dicing blade 23 is shown on the abscissa axis and in which the distance C3 from the base end of each of the conductor strips 14b, 14c to the end face to be formed is shown on the ordinate axis. FIG. 11 indicates that 81.3 (μm) on the ordinate axis resides substantially midway between nodes n=5 and n=6 and corresponds to an antinode V of a stress wave T, which results in a great CI value.

Therefore, in order that the distance C3 matches an antinode J of the stress wave T, the thickness E of the edge of the dicing blade 23 must be 138 μm (C3=87.3 μm, n=6) that is smaller than that shown in the graph or 167 μm (C3=72.8 μm, n=5) that is greater than the same.

Thus, it is possible to form the reflecting end faces 15, 16 in the present embodiment for carrying out the invention even when the dicing blade 23 is used for cutting as shown in FIG. 10 by finding a correct relationship between the edge thickness E and the cutting width F.

As will be understood by referring to FIG. 5, such accurate dicing is only required from the top surface of the piezoelectric substrate 12 up to a depth t. Once a U-shaped groove 25 shown in FIG. 10 is formed up to the depth t, a SAW device 10 having the end face configuration described in FIG. 5 can be obtained by quickly cutting off the remaining part substantially in the position of the cutting center C4 with a dicing blade having a smaller edge thickness.

Further, instead of using the dicing blade 23 in the beginning as described above, for example, the above-described U-shaped groove 25 may be formed through predetermined wet etching or dry etching to provide more accurate end face positions. In this case, again, once the U-shaped groove 25 is formed, a SAW device 10 having the end face configuration described in FIG. 5 can be obtained by quickly cutting off the remaining part substantially in the position of the cutting center C4 with a dicing blade having a smaller edge thickness.

Figure 23:
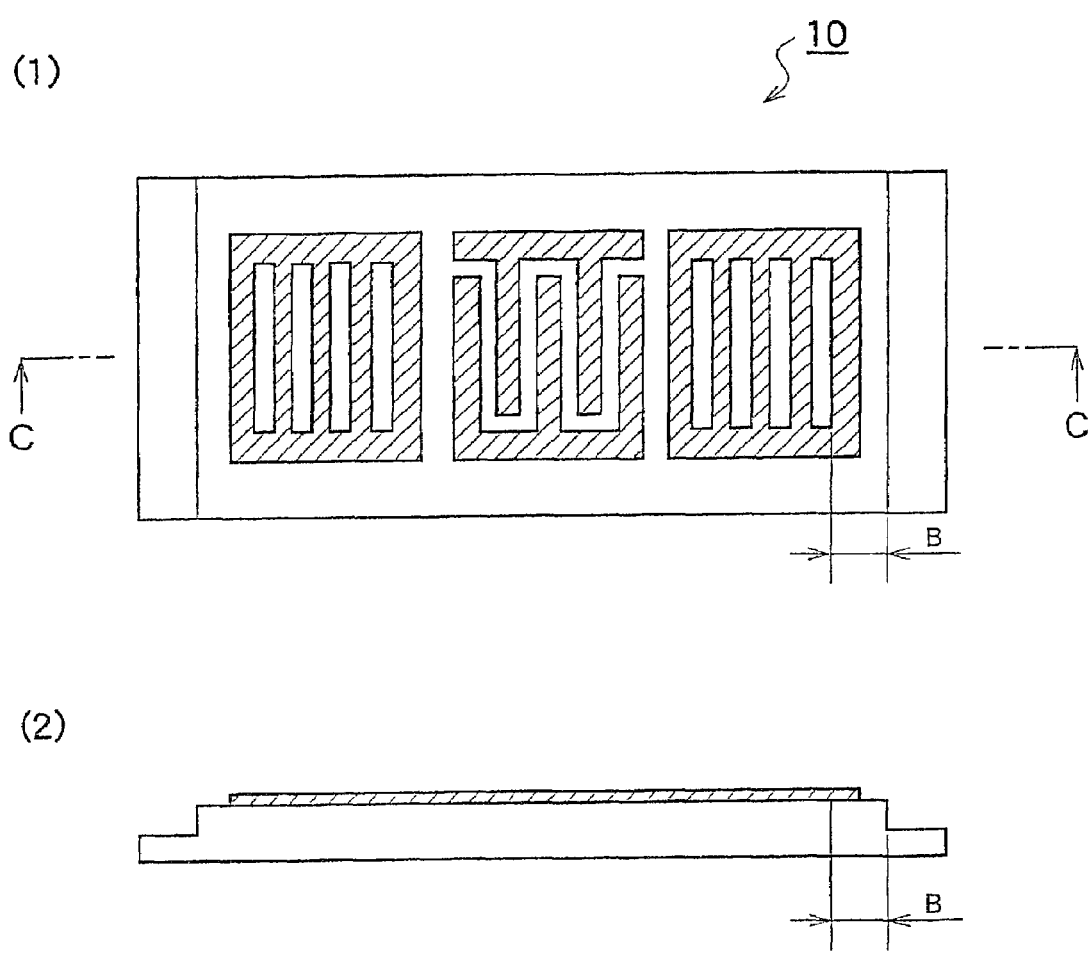
FIGS. 23(1) and 23(2) are schematics of the SAW device in FIG. 5, where FIG. 23(1) is a plan view, and FIG. 23(2) is a side sectional view taken along plane C—C of FIG. 23(1)
Figure 24:
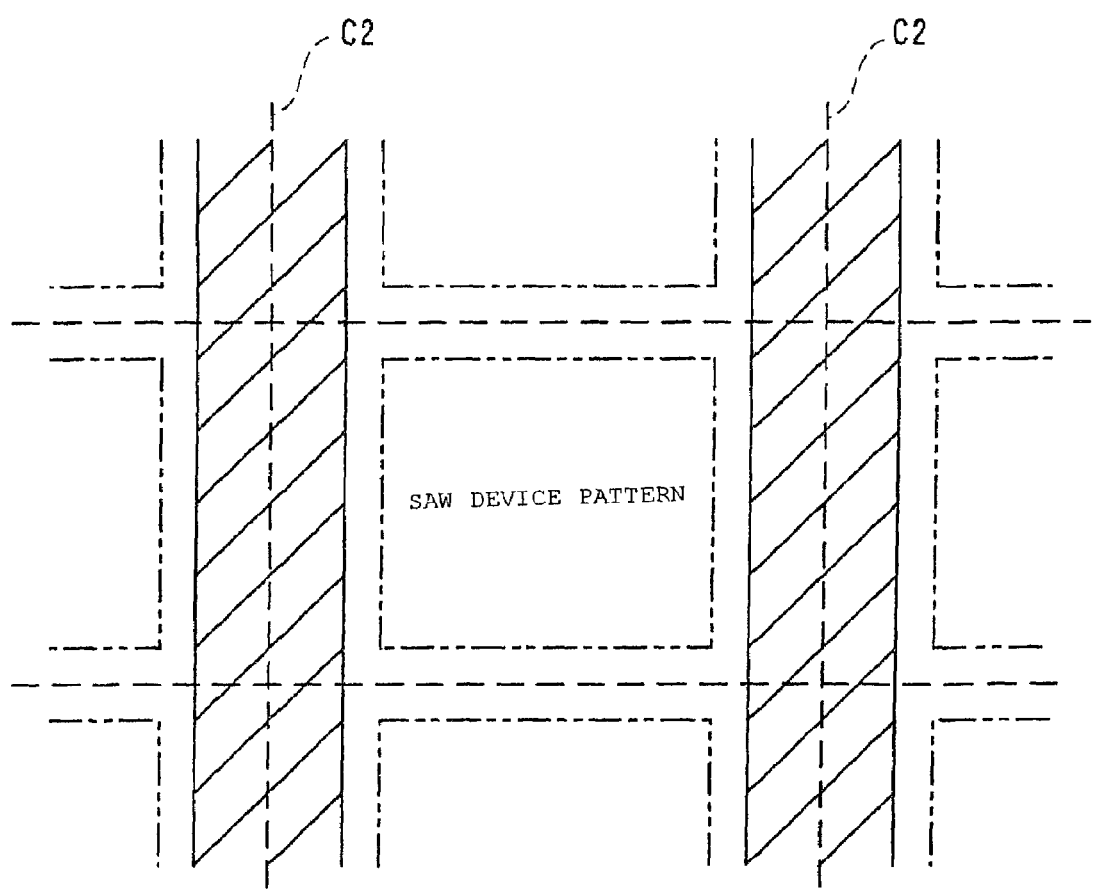
FIG. 24 is a schematic of a method of forming the SAW device shown in FIG. 23 on a wafer through etching.

FIGS. 23(1) and 23(2) are schematics of the SAW device 10 in FIG. 5. FIG. 23(1) is a plan view, and FIG. 23(2) is a side sectional view taken along plane C—C of FIG. 23(1). FIG. 24 is an illustration of a method for forming a plurality of SAW devices 10 on a wafer through etching. As indicated by hatching in FIG. 24, the wafer may be etched with a width that is equal to the cutting width F or the edge thickness E of the dicing blade around cutting lines C2 as centerlines.

When the SAW device 10 in FIG. 1 is manufactured in such a manner, the reflecting end faces can be made in a configuration in which the step portion 12 as described with reference to FIG. 5 is left. In this case, if the piezoelectric substrate 12 is processed with high accuracy up to the depth t from the top surface thereof as described above, manufacture is facilitated because the remaining part can be cut using a method for which not so high accuracy is required.

FIGS. 25(1) and 25(2) are schematics of a SAW device with grooves formed outside reflectors through etching. FIG. 25(1) is a plan view, and FIG. 25(2) is a side sectional view taken along plane A—A of FIG. 25(1).

In a SAW device 50 in FIGS. 25(1) and 25(2), grooves 52 are formed along reflectors 14 outside the reflectors 14, and reflecting end faces 15, 16 are defined by inner side surfaces of the grooves 52. The reflecting end faces 15, 16 are formed in positions B that are the same as those shown in FIG. 5.

A length s of the grooves 52 is formed as a length that is equal to or greater than a width w of an IDT 13 and the reflectors 14. Since the IDT 13 emits a Rayleigh wave over the entire width thereof, the Rayleigh wave can be entirely reflected at the reflecting end faces 15, 16 by forming the grooves 52 with the length s that is equal to or greater than the width w of the IDT 13.

A depth t of the grooves 52 is formed equal to or greater than λ/2 in the same way as shown in FIG. 5. Since a Rayleigh wave is propagated within the range from the top surface of the piezoelectric substrate to the depth λ/2, the Rayleigh wave can be entirely reflected at the reflecting end faces 15, 16 by setting the depth t of the grooves 52 equal to or greater than λ/2.

Further, a width r of the grooves 52 is formed as a width that is n×PR. As a result, even if a Rayleigh wave passes through the reflecting end faces 15, 16 constituted by inner side surfaces of the grooves 52, the Rayleigh wave that has passed is reflected by outer side surfaces of the grooves 52. This makes it possible to reflect a Rayleigh wave reliably.

Figure 26:
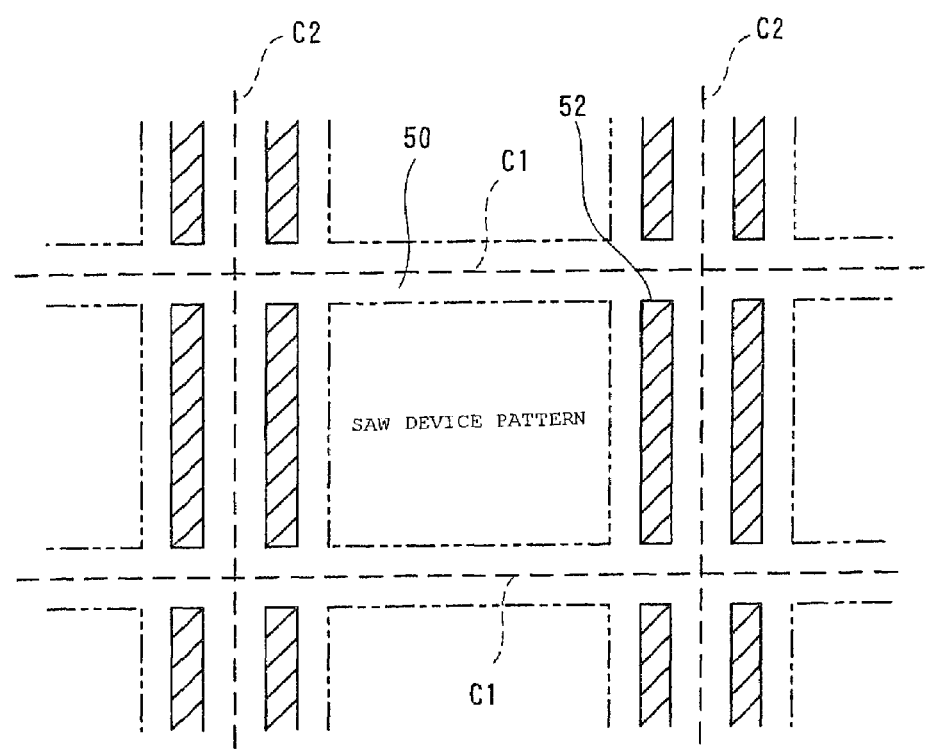
FIG. 26 is a schematic of a method of forming the SAW device shown in FIGS. 25(1) and 25(2) on a wafer through etching.

FIG. 26 is a schematic of a method for forming a plurality of SAW devices 50 on a wafer through etching. All of grooves 52 of the SAW devices 50 on the wafer indicated by hatching in FIG. 26 are simultaneously formed through etching.

Dry etching is used to etch the grooves 52. A gas including fluorine, such as a CF-type gas, such as $C_4F_8$, or a SF-type gas, such as $SF_6$, is used as etching gas for the dry etching. The etching gas is changed into plasma to produce fluorine radicals, and etching is performed by processing the piezoelectric substrate with the fluorine radicals.

The quantity of fluorine radicals produced can be increased by adding an oxygen gas to the etching gas, which increases the density of the plasma and consequently makes it possible to increase the etching rate. The addition of a rare gas having a small molecular weight such as He or Ar makes it possible to generate plasma and to maintain the generated plasma with low energy.

Figure 27:
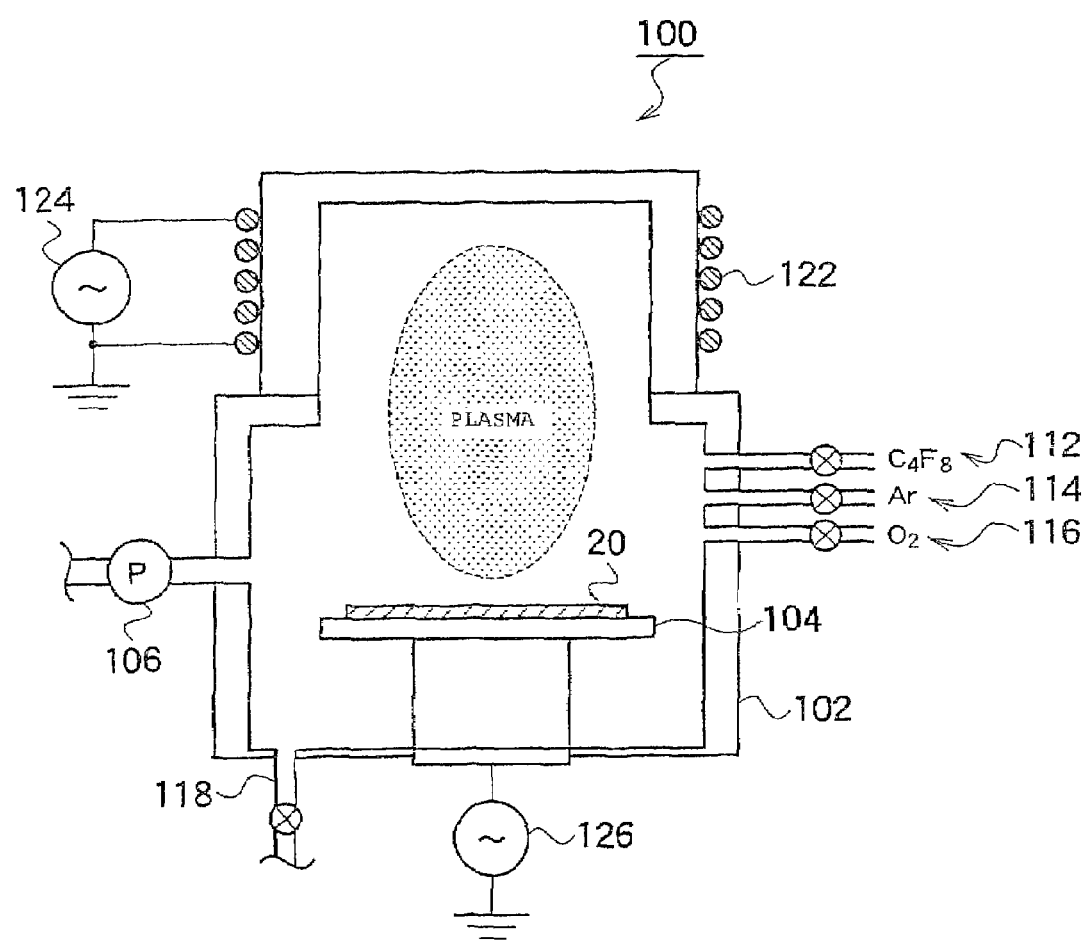
FIG. 27 is a schematic of an ICP dry etching apparatus.

An ICP dry etching apparatus as is described below may be used to perform the dry etching of the piezoelectric substrate. FIG. 27 shows an illustration of the ICP dry etching apparatus. Referring to an ICP (inductively coupled plasma) dry etching apparatus 100, a chamber 102 is first provided. A table 104 on which a wafer 20 is to be placed is provided in the chamber 102. Further, a vacuum pump 106 to evacuate the chamber 102 is provided.

There are also provided an etching gas supplying device 112 to supply an etching gas into the chamber 102, an inert gas supplying device 114 to supply an inert gas, and an oxygen gas supplying device 116 to supply an oxygen gas. An exhaust pipe 118 to discharge a used gas in the chamber 102 is provided. The exhaust pipe 118 is connected to an exhaust pump which is not shown and is also connected to a detoxifier which is not shown, and this makes it possible to discharge the used gas to the outside.

An induction coil 122 is provided outside an upper part of the chamber 102 such that it surrounds the chamber 102. The induction coil 122 is connected to a first high frequency power source 124. The stage 104 is connected to a second high frequency power source 126.

The etching gas is changed into plasma by a magnetic field generated in the chamber 102 by the induction coil 122, and fluorine radicals are thus generated. Further, a bias electric field generated in the chamber 100 by the second high frequency power source 126 causes the fluorine radicals to act on the wafer 20 vertically from above, thereby causing anisotropic etching. The use of the above-described ICP dry etching apparatus 100 makes it possible to achieve an etching rate of 1 to 2 µm/min for example, and the etching of the grooves is completed in about 15 to 30 minutes.

Figure 28:
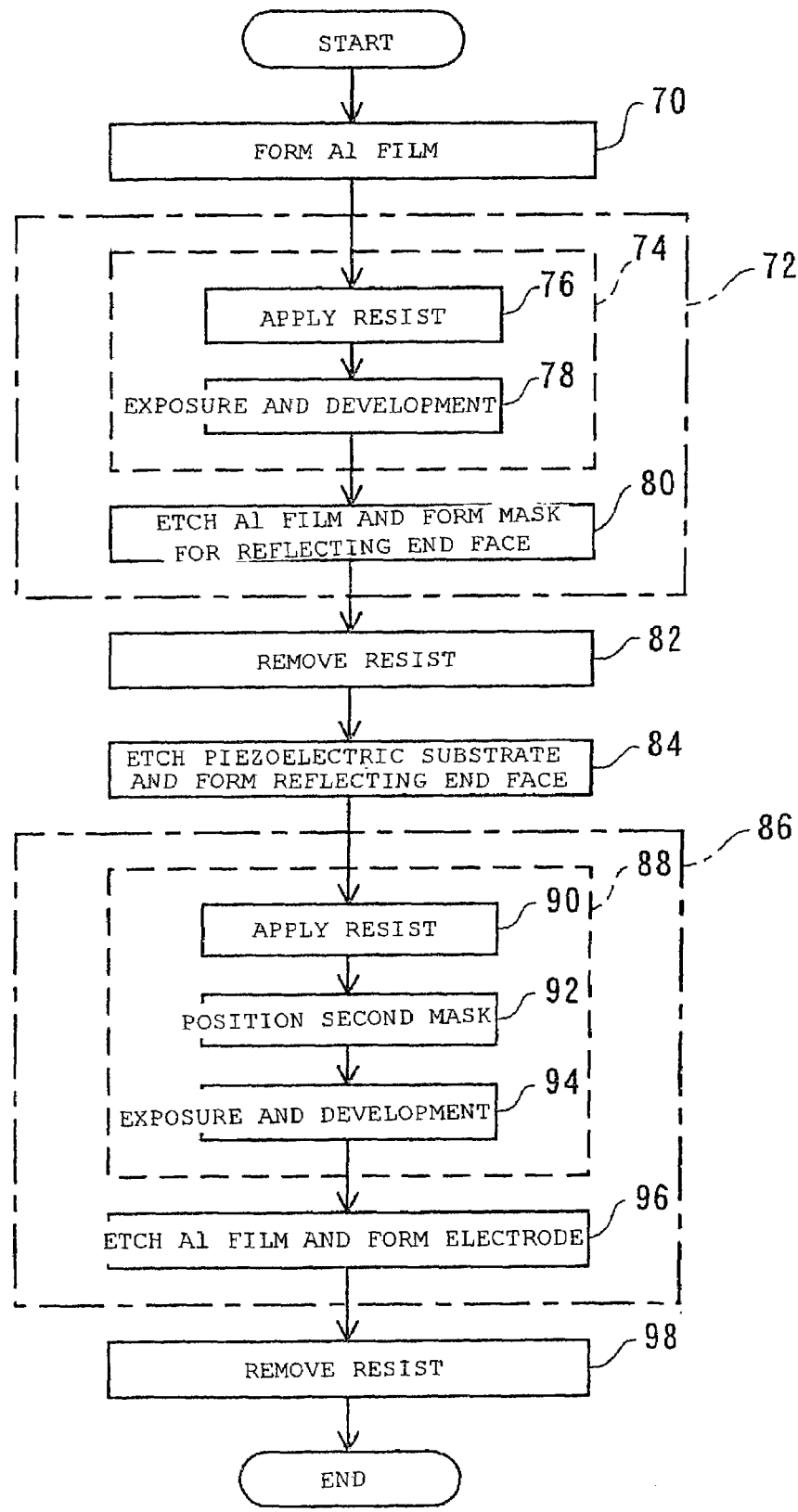
FIG. 28 is a flow chart of steps for manufacturing the SAW device shown in FIGS. 25(1) and 25(2)

FIG. 28 is a flow chart of steps for manufacturing the SAW device 50 shown in FIGS. 25(1) and 25(2). FIGS. 29(1)–31(4) are schematics of steps for manufacturing the SAW device 50. The steps described below are simultaneously performed on a plurality of SAW devices 50 formed on the same wafer.

First, a film 54 of Al or the like that is an electrode material is formed on a top surface of a piezoelectric substrate 12, as shown in FIG. 29(1) (step 70). The electrode material film 54 is formed using a vacuum deposition process, sputtering process, or the like.

First patterning is then performed on the electrode material film 54 to form a mask to form reflecting end faces (step 72). The first patterning step is constituted by a lithography step (step 74) and a step of etching the electrode material film (step 80). Photolithography in which a resist is optically exposed may be employed at the lithography step. First, as shown in FIG. 29(2), a resist 56 is applied on the top surface of the electrode material film 54 (step 76). Next, the resist 56 is exposed for development through a first photo-mask that is not shown (step 78). Configurations of parts of the piezoelectric substrate 12 to be etched are drawn on the first photo-mask. This eliminates the resist from the parts of the electrode material film 54 to be etched, as shown in FIG. 29(3).

Next, as shown in FIG. 30(1), the electrode material film 54 is etched using the resist 56 as a mask (step 80). The ICP dry etching apparatus 100 shown in FIG. 27 may be also used to etch the electrode material film 54. When the electrode material film 54 is an Al film, a gas including chlorine, such as carbon tetrachloride ($CCl_4$) or boron trichloride ($BCl_3$), is used as an etching gas. Chlorine radicals generated by changing the gas into plasma are caused to react with the Al film, which eliminates the Al film by generating $AlCl_4$. The electrode material film 54 is thus patterned to form a mask 55 to form reflecting end faces.

Next, as shown in FIG. 30(2), the resist 56 is removed (step 82). The resist is removed using methods, such as processing with ozone water. At a reflecting end face forming step described below, etching of the piezoelectric substrate 12 may be performed for a relatively long time to remove the resist 56 simultaneously.

Next, as shown in FIG. 30(3), the piezoelectric substrate 12 is etched using the mask 55 to form reflecting end faces (step 84). The ICP dry etching apparatus 100 shown in FIG. 27 may be used to etch the piezoelectric substrate 12. Specific steps of the etching are as follows.

First, the piezoelectric substrate 12 (wafer 20) on which the processes up to step 82 have been completed is placed on the stage 104 in the chamber 102. Next, the vacuum pump 106 is operated to reduce the pressure in the chamber 102 to about 0.02 Torr (2.67 Pa). Each gas is then supplied to the interior of the chamber 102. Specifically, $C_4F_8$ gas is supplied from the etching gas supplying device 112 at a flow rate of 30 sccm; Ar gas is supplied from the rare gas supplying device 114 at a flow rate of 10 sccm; and oxygen gas is supplied from the oxygen gas supplying device 116 at a flow rate of 2 sccm.

Next, the output of the first high frequency power source 124 is set at about 1200 W, and the induction coil 122 is energized to generate a magnetic field in the chamber 102. Ar molecules in the chamber are first activated, and the activated Ar molecules collide with $C_4F_8$ molecules to activate the $C_4F_8$ molecules. Fluorine radicals are generated from the activated $C_4F_8$ molecules. A great quantity of fluorine radicals are generated further as a result of a reaction between the activated $C_4F_8$ molecules and oxygen molecules.

Next, the output of the second high frequency power source 126 is set at about 300 W to generate a bias electric field in the chamber 102 through the stage 104. This forces the fluorine radicals thus generated to act on the piezoelectric substrate 12 vertically from above. When the piezoelectric substrate 12 is made of a quartz material, $SiF_4$ is produced to remove the quartz material. Anisotropic etching is thus performed on the piezoelectric substrate 12 in the vertical direction. Since the mask 55 to form reflecting end faces is used, etching is performed only in regions where reflecting end faces 15, 16 are to be formed.

Next, second patterning is performed on the electrode material film 54 to form IDT, reflectors, and so on (step 86). Similarly to the first patterning step, the second patterning step is constituted by a lithography step (step 88) and a step of etching the electrode material film (step 96). Photolithography in which a resist is optically exposed may be employed at the lithography step. First, as shown in FIG. 31(1), a resist 57 is applied to a top surface of the electrode material film 54 (step 90).

Figure 32:
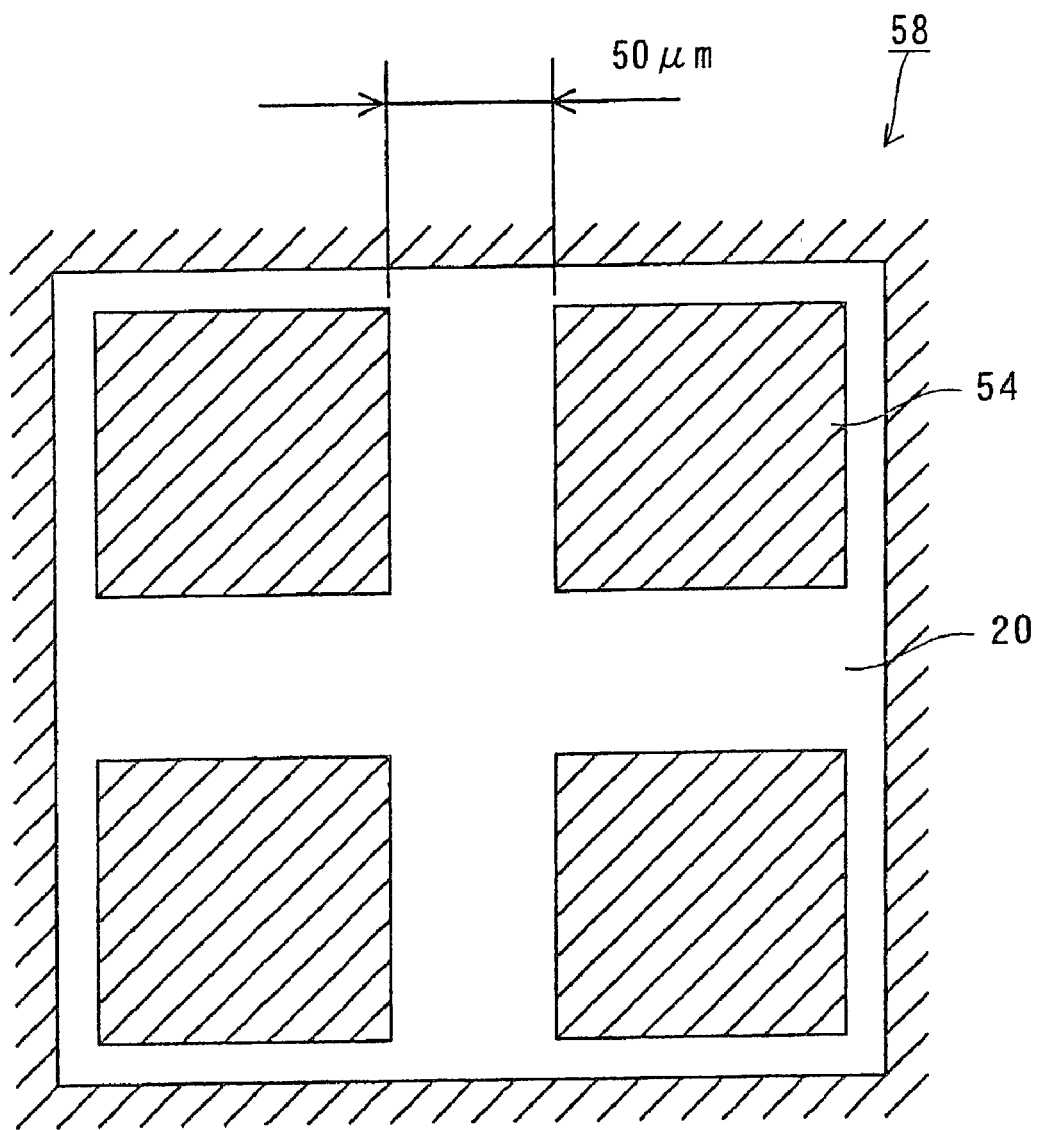
FIG. 32 is a plan view of an alignment mark patterned on a wafer.

A second photo-mask is then positioned relative to the piezoelectric substrate 12 (step 92). As a precondition for this, in the first patterning step, an alignment mark is patterned in any position on the top surface of the wafer. Preferably, two or more alignment marks are patterned to allow the second photo-mask to be positioned relative to the wafer in a rotating direction thereof. For example, a mark 58 shown in FIG. 32 is formed as an alignment mark. Specifically, the top surface of the wafer 20 in a light color is exposed in the form of a cross by etching the electrode material film 54 that is in a dark color. While the cross is formed by providing four squares at equal intervals, each of the intervals at which the squares are provided is 50 µm, for example.

Figure 33:
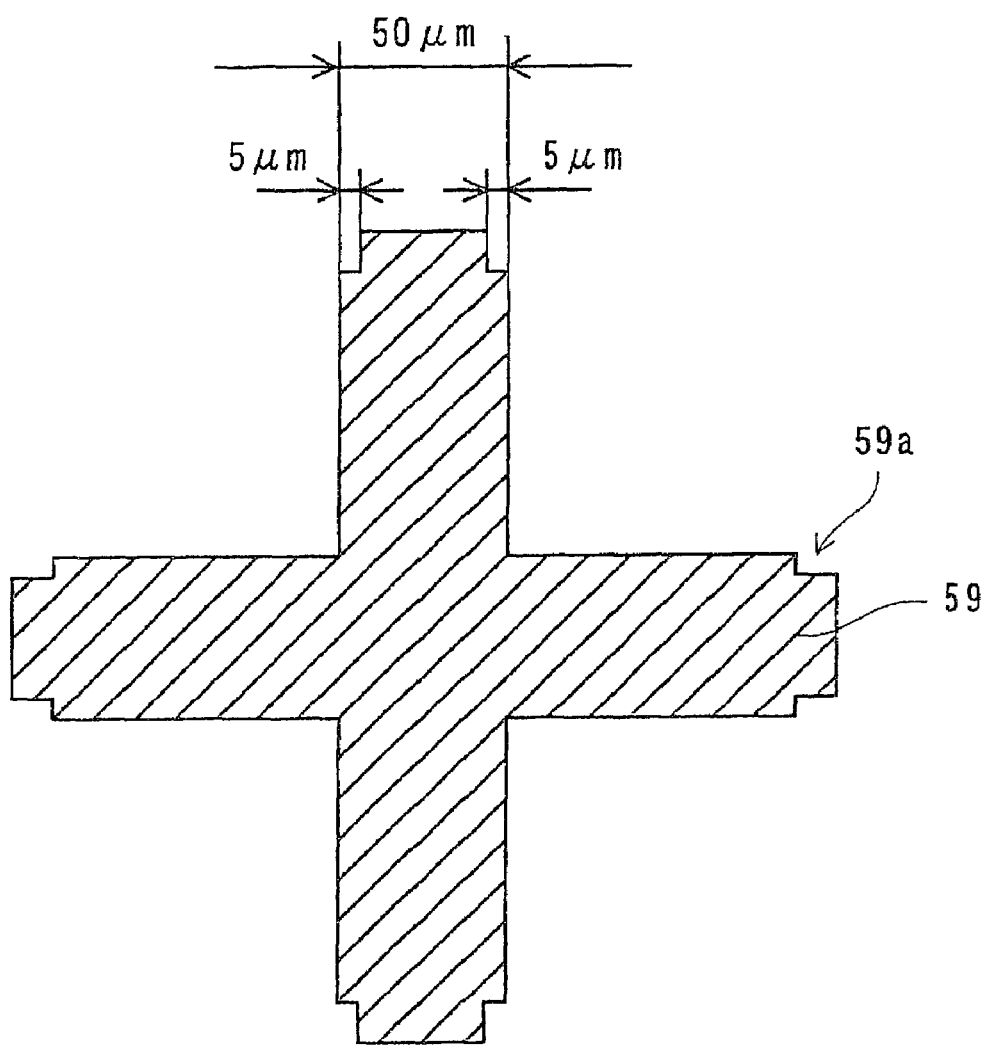
FIG. 33 is a plan view of an alignment mark drawn on a second photo-mask.

An alignment mark is also drawn on the second photo-mask in association with the mark 58 on the wafer. For example, a mark 59 shown in FIG. 33 is formed as the alignment mark. Specifically, a cross 59 in the same configuration as the cross of the mark 58 is drawn in a dark color in a translucent portion of the second photo-mask. The cross 59 is formed by overlapping two rectangles in the middle thereof, and cut-outs 59a are provided at the four corners of the two rectangles forming the cross 59, the cut-outs extending a predetermined width from the longer sides of the respective rectangles. The predetermined width is matched with (PR/2)δ that is an allowance for a position for forming a reflecting end face shown in FIG. 5. For example, in a SAW device having a frequency of 106.25 MHz, the allowance for a position to form a reflecting end face is about 5 µm where the number of the electrode digits of the IDT and the number of the conductor strips of the reflectors are 80 each and where the CI values are 40 Ω or less.

Figure 34:
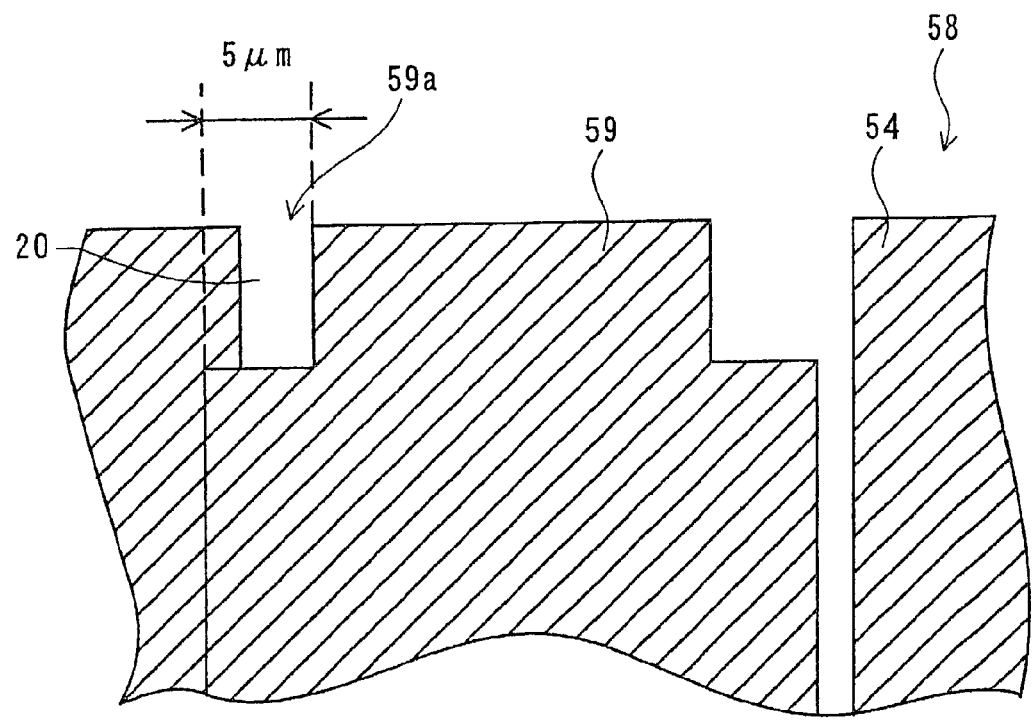
FIG. 34 is a plan view of the alignment mark shown in FIG. 32 and the alignment mark shown in FIG. 33 in an overlapped state.

As shown in FIG. 34, the cross of the mark 59 on the second photo-mask is overlapped with the cross of the mark 58 on the wafer. The second photo-mask is fixed in a position in which the light color of the wafer 20 can be recognized through all of the cut-outs 59a of the mark 59. By performing the second patterning step using the second photo-mask thus fixed, the positions of reflecting end faces formed at the first patterning step stay within the allowance relative to an electrode that is formed at the second patterning step.

Next, the resist 57 is exposed for development through the second photo-mask that is not shown (step 94). The configuration of an electrode pattern to be formed is drawn on the second photo-mask along with the above-described mark 59. As shown in FIG. 31(2), the resist is thus removed from parts of the electrode material film 54 to be etched.

Next, as shown in FIG. 31(3), the electrode material film 54 is etched using the resist 57 as a mask (step 96). The process is specifically the same as that at step 80 of the first patterning step. The electrode material film 54 is thus patterned to form the IDT, reflectors, and so on.

Finally, the resist 57 is removed as shown in FIG. 31(4) (step 98). This completes a SAW device 50.

A method for etching a piezoelectric substrate is described above in which an electrode material film for forming an electrode is also used to produce a mask to form reflecting end faces. However, this should not be construed as limiting methods of the invention for producing a mask to form reflecting end faces. For example, a mask to form reflecting end faces may be produced by forming a mask material film separately other than an electrode material film. Cr, Ag, tungsten, and so on may be used as a mask material.

In this case, a mask material film is formed at step 70, and the first patterning step at step 72 is performed to form a mask to form reflecting end faces. After the etching of the piezoelectric substrate is completed at step 84, the mask to form reflecting end faces constituted by the mask material film is removed. Next, an electrode material film is formed, and the second patterning step at step 86 is performed to produce an electrode. A SAW device 50 can be similarly formed using this method.

Figure 35:
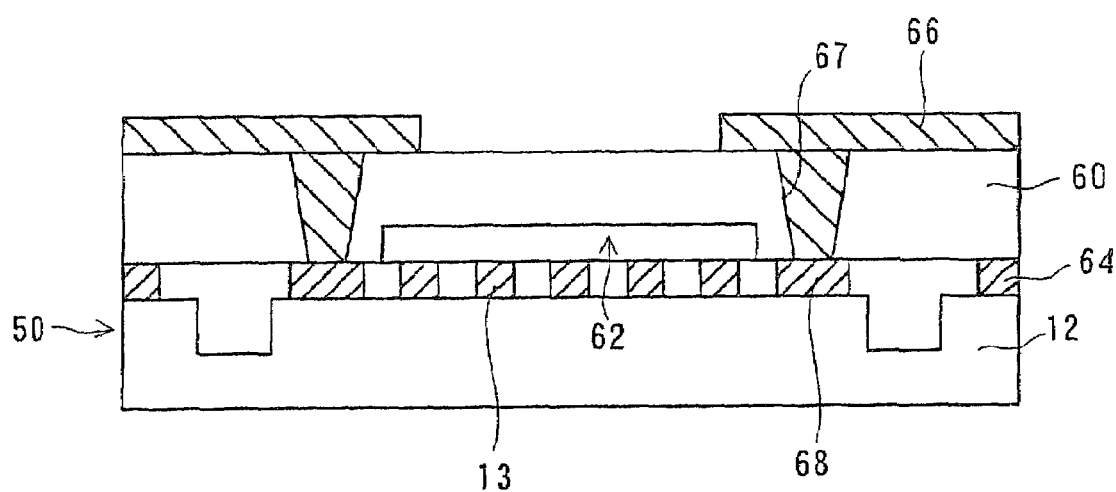
FIG. 35 is a side sectional view of the SAW device shown in FIGS. 25(1) and 25(2) with a cap member attached thereto.

FIG. 35 is a side sectional view of a SAW device 50 having a cap member attached thereto. A SAW device 50 formed as described above is used by attaching a cap member 60 to keep a SAW propagation surface airtight in order to prevent any frequency change attributable to oxidation of the IDT 13 or the like. The cap member 60 is formed by a glass substrate or the like. A cavity 62 is formed in the middle of the cap member 60 to keep the IDT 13 and the like in a nitrogen atmosphere. A sealed electrode 64 is formed from a material for forming an electrode at a peripheral part of the top surface of the piezoelectric substrate 12. The sealed electrode 64 and the cap member 60 are anodically bonded to keep the SAW propagation surface of the piezoelectric substrate 12 airtight.

An external electrode 66 is provided on a surface of the cap member 60 to energize the IDT 13 from the outside. A through hole 67 penetrating through the cap member 60 is formed above an electrode pad 68 of the IDT. The through hole 67 is filled with a conductive material to establish continuity between the electrode pad 68 of the IDT and the external electrode 66, thereby allowing the IDT 13 to be energized from the outside.

Figure 36:
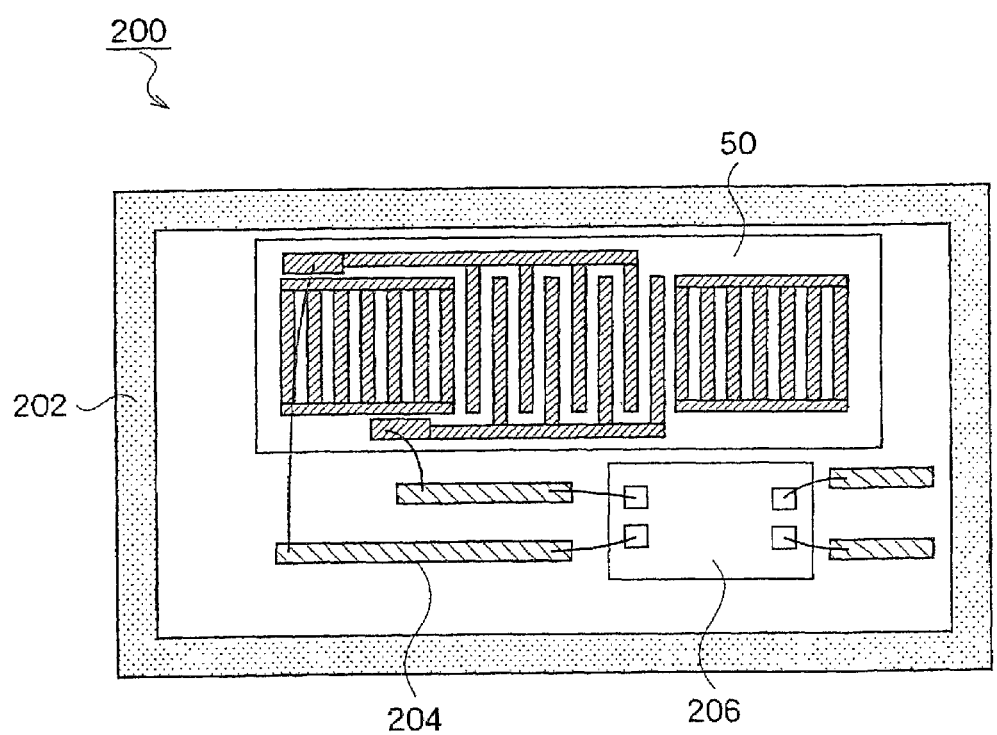
FIG. 36 is a plan view of a SAW oscillator.

FIG. 36 is a plan view of a SAW oscillator formed using a SAW device 50. A SAW oscillator 200 is an oscillation circuit that is formed by forming a wiring pattern 204 on a top surface of a package 202 made of ceramic or the like and mounting a SAW device 50 formed as described above and an integrated circuit element (IC) 206 on the same. The SAW device 50 and the integrated circuit element 206 are connected to the wiring pattern 204 by wire boding or the like. To prevent oxidation of the IDT and so on of the SAW device 50 or to prevent foreign substances from entering, a cap member is attached to the top surface of the package 202.

Figure 37:
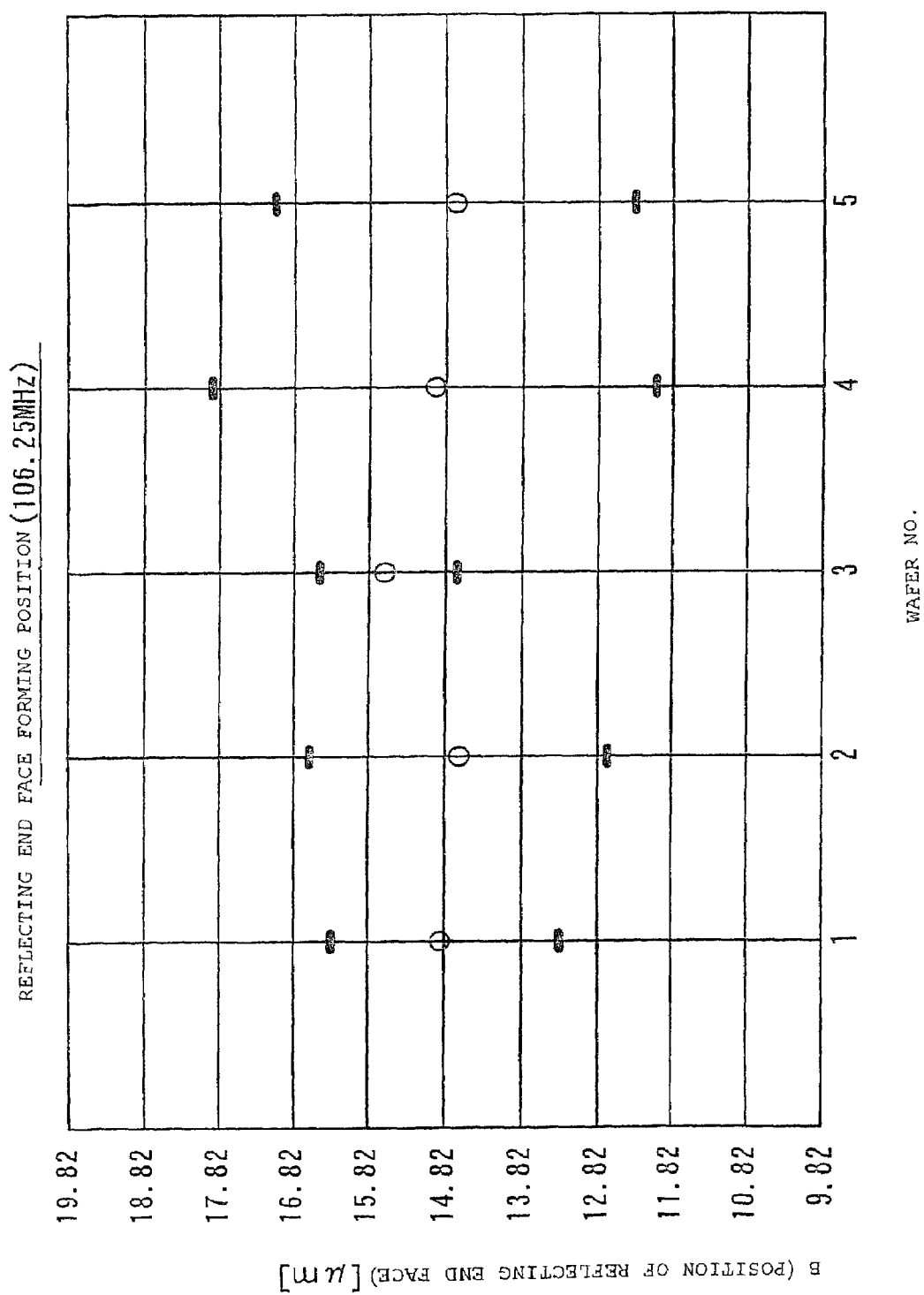
FIG. 37 is a graph showing a result of measurement of variations in the positions of reflecting end faces that are formed through etching.

FIG. 37 is a graph showing a result of measurement of variations in the positions of reflecting end faces that are formed through etching. The reflecting end faces were formed through etching according to the above-described method, and a distance B from base ends of the outermost conductor strips of the reflectors to the reflecting end faces was measured. Since 100 or more SAW devices were simultaneously formed from a single wafer, the positions of reflecting end faces were measured on 30 devices that were extracted from them at random. Measured values of the distance B are plotted along the ordinate axis of the graph in FIG. 37 in which an average value is indicated by O and values that are an average value±3σ (σ represents a standard deviation) are indicated by error bars. A design value is 7.36 µm. The measurement was similarly conducted on SAW devices produced from five wafers. Numbers assigned to the wafers from which the SAW devices were formed are shown on the abscissa axis of FIG. 37.

The SAW devices on which the measurement of reflecting end face positions was conducted had a frequency of 106.25 MHz. Therefore, the allowance for the distance B is expressed by the following equation as shown in FIG. 5.

$$B = \text{design value} \pm (PR/2) \cdot \delta$$

$$B = \text{design value} \pm (14.82/2) \cdot 0.68$$

$$B = \text{design value} \pm 5.04 \ (\mu m)$$

FIG. 37 shows that most of the SAW devices on each wafer are formed within the allowance. It was confirmed that dimensional accuracy can be maintained as described above by forming reflecting end faces through etching.

FIGS. 38(1) and 38(2) are graphs showing a result of measurement of CI values of a plurality of SAW devices. FIG. 38(1) shows a result of measurement of CI values of SAW devices whose reflecting end faces are formed through etching, and FIG. 38(2) shows a result of measurement of CI values of SAW devices whose reflecting end faces are not formed as described above.

While SAW devices having high CI values are included in FIG. 38(2), the CI values in FIG. 38(1) concentrates in a range of low values from 20 to 25 Ω. Since dimensional accuracy can be maintained by forming reflecting end faces through etching, CI values can be kept small as described above. The use of a SAW device having a reduced CI value makes it possible to maintain a tolerance for oscillation of an integrated circuit element (IC) of a SAW oscillator or the like.

Figure 12:
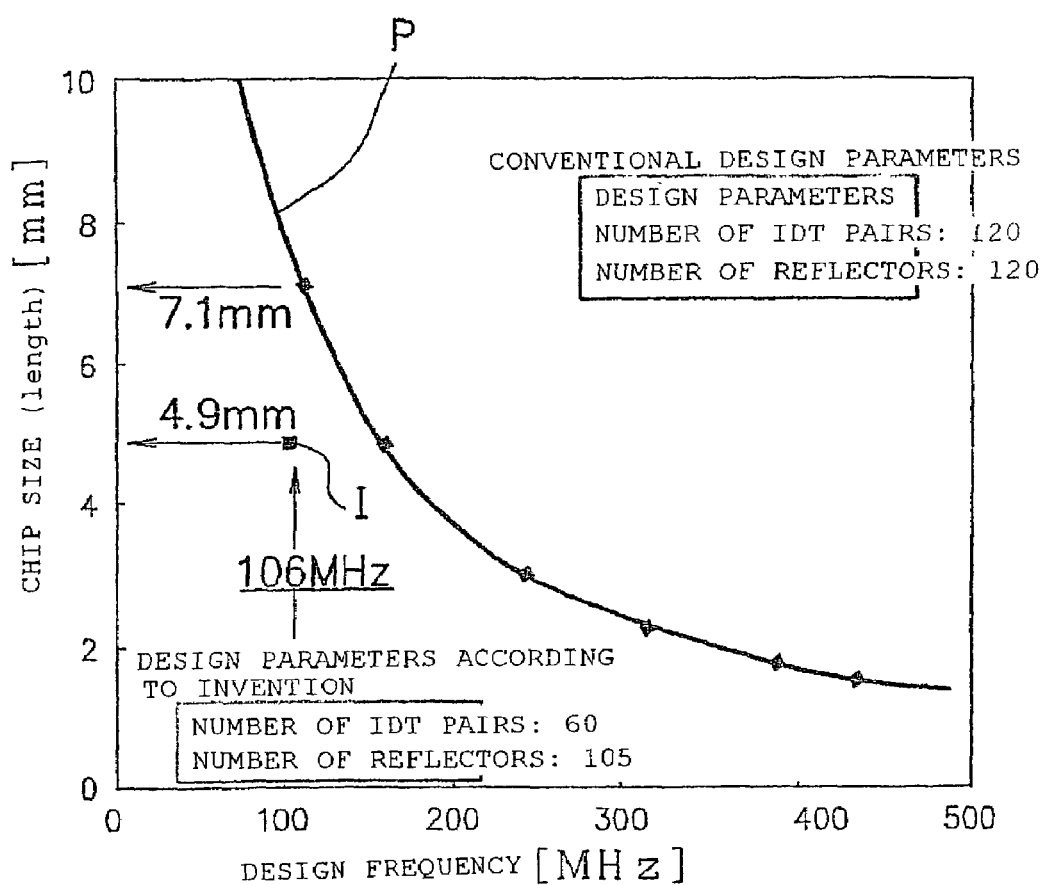
FIG. 12 is a graph that shows changes in the size of a piezoelectric substrate in which design frequencies of the SAW device are shown on the abscissa axis and in which the number of conductor strips required for an IDT and reflectors associated with each frequency is formed on the ordinate axis.

In FIG. 12, changes in the size of electrodes (reflectors/IDT/reflector) of a related art SAW device 1 in accordance with frequencies are represented by a curve P, design frequencies being shown on the abscissa axis, and required numbers of conductor strips being shown on the ordinate axis.

The curve P shows that when a SAW device having a frequency of 106 MHz is fabricated according to related art design parameters, for example, the IDT has 120 pairs of electrodes; the reflectors have 120 conductor strips; and the size of the piezoelectric substrate or the size (length) of the chip is about 7.1 mm.

However, a SAW device 10 in the present embodiment for carrying out the invention can be made significantly small in that as indicated by the point I, the IDT has 60 pairs of electrodes; the reflectors have 105 conductor strips; and the size of the piezoelectric substrate or the size (length) of the chip is about 4.9 mm.

Figure 13:
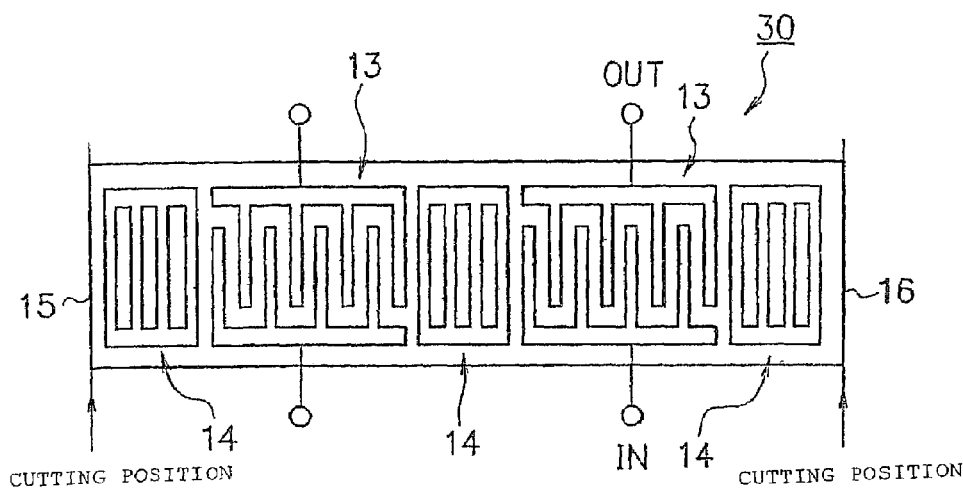
FIG. 13 is a schematic plan view showing a second embodiment of a SAW device according to the invention.

FIG. 13 is a schematic plan view showing a SAW device 30 according to a second embodiment for carrying out the invention.

Elements shown in FIG. 13 that are assigned reference numerals identical to those in FIGS. 1 and 2 are common configurations which will not be described here to avoid repetition.

The SAW device 30 is a dual port type in which two IDT's 13, 13 are arranged in a row; reflectors 14, 14 are provided outside respective IDT's; another reflector 14 is provided between the IDT's 13, 13; and two each input and output terminals are provided.

Reflecting end faces 15, 16 can be formed in the SAW device 30 in the same manner as in the above-described SAW device 10 to achieve similar operations and effects.

Figure 14:
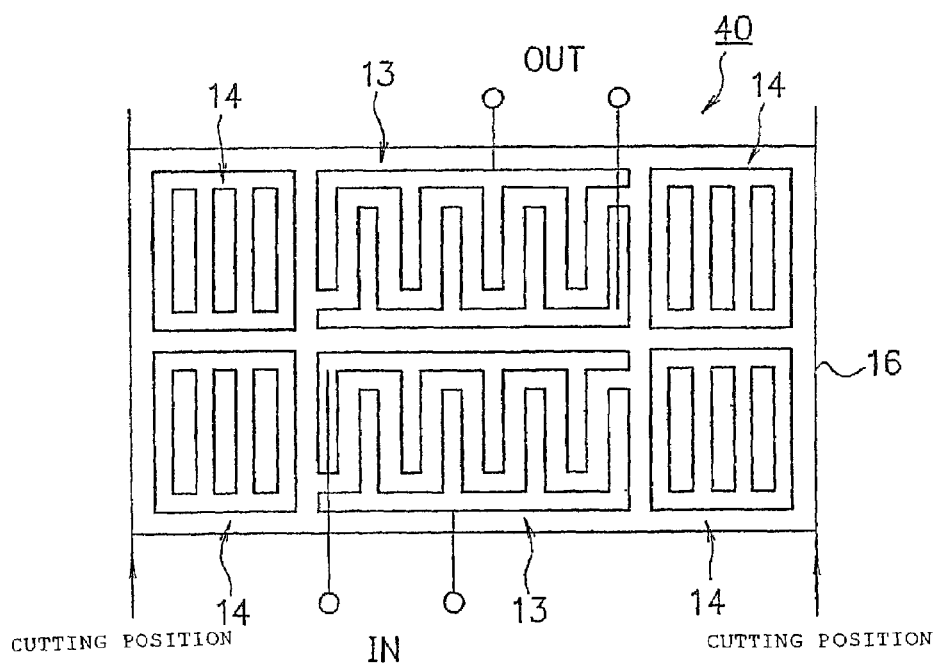
FIG. 14 is a schematic plan view showing a third embodiment of a SAW device according to the invention.

FIG. 14 is a schematic plan view showing a SAW device 40 according to a third embodiment for carrying out the invention.

Elements shown in FIG. 14 that are assigned reference numerals identical to those in FIGS. 1 and 2 are common configurations which will not be described here to avoid repetition.

The SAW device 40 is a dual mode type having a filtering function in which two IDT's 13, 13 are arranged in parallel; reflectors 14, 14 are provided outside respective IDT's; and two each input and output terminals are provided.

Reflecting end faces 15, 16 can be formed in the SAW device 40 in the same manner as in the above-described SAW device 10 to achieve similar operations and effects.

The invention is not limited to the above-described embodiments for carrying out the same and may be applied to any type of SAW devices within the scope of the teachings of the invention set forth in the claims.

In particular, each of the configurations in the above-described embodiments for carrying out the invention may be omitted as occasions demand, and any combination with other configurations different from them or any combination between the described combinations is possible.

As described above, the invention makes it possible to provide a surface acoustic device adapted to a low frequency in which a Rayleigh wave can be reflected at end faces of a piezoelectric substrate to reduce the number of conductor strips of the reflectors, thereby allowing the reflectors to be formed with a small size.

What is claimed is:

1. A surface acoustic wave device, comprising:

a piezoelectric substrate in the form of a rectangular plate in which a Rayleigh wave is propagated, the piezoelectric substrate defining at least an end face of a shorter side; and interdigital electrodes formed on the piezoelectric substrate to provide an IDT and a reflector, conductor strips being provided at an end of the reflector, the end face of the shorter side of the piezoelectric substrate being formed as a vertical smooth surface that is substantially in parallel with the conductor strips at the end of the reflector in a position of an imaginary node of a stress wave exiting the conductor strips, thereby providing a reflecting end face to reflect the stress wave, the reflecting end face being constituted by an inner side surface of a groove formed along the reflector and outside the reflector on a top side of the piezoelectric substrate.

2. The surface acoustic wave device according to claim 1, the reflecting end face being provided to a depth at a predetermined distance from a top surface of the piezoelectric substrate in the position of the imaginary node of the stress wave and being configured with a step portion at a bottom end of the reflecting end face.

3. The surface acoustic wave device according to claim 1, the reflecting end face being formed when a wafer constituting the piezoelectric material is cut into a size to form each piezoelectric substrate, and at least a part corresponding to the reflecting end face being formed through etching.

4. The surface acoustic wave device according to claim 1, wherein a distance B from the base end of the conductor strips at the end of the reflector to the reflecting end face is determined according to the relationship:

$$B=(n \times PR) \pm (PR/2) \times \delta$$

where $\lambda$ is a wavelength of a Rayleigh wave, n is an integer, PR=$\lambda$/2, a width of the groove is n×PR, and $\delta$ is an allowance value in a range of ±1 associated with a position of the reflecting end face and the number of the conductor strips of the reflector when the number of pairs of electrode digits of the IDT is fixed.

* * * * *